(12) United States Patent
Katoh et al.

(10) Patent No.: US 9,608,629 B2
(45) Date of Patent: Mar. 28, 2017

(54) USE OF RELATIVE PERMITTIVITY IN DIFFERENT MATERIALS TO ENHANCE CAPACITIVE SWITCH SENSITIVITY

(71) Applicant: DENSO CORPORATION, Kariya, Aichi-pref. (JP)

(72) Inventors: Atsushi Katoh, Obu (JP); Yoshihide Sahashi, Chiryu (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 4 days.

(21) Appl. No.: 14/780,991

(22) PCT Filed: Mar. 17, 2014

(86) PCT No.: PCT/JP2014/001488
§ 371 (c)(1),
(2) Date: Sep. 28, 2015

(87) PCT Pub. No.: WO2014/162668
PCT Pub. Date: Oct. 9, 2014

(65) Prior Publication Data
US 2016/0049933 A1    Feb. 18, 2016

(30) Foreign Application Priority Data

Apr. 1, 2013 (JP) .................................. 2013-076200
Apr. 1, 2013 (JP) .................................. 2013-076201
(Continued)

(51) Int. Cl.
*H03K 17/975* (2006.01)
*H03K 17/96* (2006.01)

(52) U.S. Cl.
CPC . *H03K 17/962* (2013.01); *H03K 2217/96023* (2013.01); *H03K 2217/96077* (2013.01);
(Continued)

(58) Field of Classification Search
CPC . H03K 17/962; H03K 17/9622; H03K 17/955
(Continued)

(56) References Cited

U.S. PATENT DOCUMENTS 7,583,092 B2 * 9/2009 Reynolds ............. H03K 17/955
324/686
8,810,341 B2 * 8/2014 Bachman ............ H01H 59/0009
200/181
(Continued)

FOREIGN PATENT DOCUMENTS

JP    H02312123 A    12/1990
JP    H03225719 A    10/1991
(Continued)

OTHER PUBLICATIONS

International Search Report and Written Opinion (in Japanese with English Translation) for PCT/JP2014/001488, mailed May 13, 2014; ISA/JP.

*Primary Examiner* — Vanessa Girardi
(74) *Attorney, Agent, or Firm* — Harness, Dickey & Pierce, P.L.C.

(57) ABSTRACT

In the present invention, a capacitance-type switch is provided with an operation plate and an electrode plate. The operation plate forms operation surfaces operated by the touch of a fingertip F (operation body) of a user. The electrode plate is disposed on the side of the operation plate opposite the operation surfaces. Furthermore, the capacitance-type switch is turned on and off in response to the change in capacitance caused between the fingertip F and the electrode plate. In addition, a high-permittivity material is disposed in an outer circumferential section of the electrode plate, the high-permittivity material having a higher permittivity than the operation plate. It is possible to improve the sensitivity of the capacitance-type switch while minimizing malfunctioning.

13 Claims, 22 Drawing Sheets

(30) Foreign Application Priority Data

| Apr. 1, 2013 | (JP) | 2013-076202 |
|---|---|---|
| Apr. 1, 2013 | (JP) | 2013-076203 |
| Dec. 12, 2013 | (JP) | 2013-257240 |

(52) U.S. Cl.
CPC ............ *H03K 2217/960755* (2013.01); *H03K 2217/960785* (2013.01)

(58) Field of Classification Search
USPC ............ 200/181, 600; 341/33; 307/113, 115
See application file for complete search history.

(56) References Cited

U.S. PATENT DOCUMENTS

| 8,823,393 | B2* | 9/2014 | Aubauer | F24C 7/082 |
|---|---|---|---|---|
| | | | | 324/658 |
| 9,209,803 | B2* | 12/2015 | Bruwer | H03K 17/955 |
| 9,467,141 | B2* | 10/2016 | Lundstrum | H03K 17/962 |

| 2007/0211483 | A1 | 9/2007 | Ando et al. |
|---|---|---|---|
| 2008/0302649 | A1 | 12/2008 | Yamauchi et al. |
| 2009/0033636 | A1 | 2/2009 | Toyota et al. |
| 2012/0218029 | A1 | 8/2012 | Furuta et al. |
| 2013/0214848 | A1 | 8/2013 | Long et al. |

FOREIGN PATENT DOCUMENTS

| JP | 2004335273 A | 11/2004 |
|---|---|---|
| JP | 2005317422 A | 11/2005 |
| JP | 2006133029 A | 5/2006 |
| JP | 2006344163 A | 12/2006 |
| JP | 2007087878 A | 4/2007 |
| JP | 2007230450 A | 9/2007 |
| JP | 2007242571 A | 9/2007 |
| JP | 2008305766 A | 12/2008 |
| JP | 2009037373 A | 2/2009 |
| JP | 2011113893 A | 6/2011 |
| JP | 2012178233 A | 9/2012 |
| JP | 2012251030 A | 12/2012 |
| WO | WO-2012058841 A1 | 5/2012 |

* cited by examiner

USE OF RELATIVE PERMITTIVITY IN DIFFERENT MATERIALS TO ENHANCE CAPACITIVE SWITCH SENSITIVITY

CROSS REFERENCE TO RELATED APPLICATIONS

This application is a U.S. National Phase Application under 35 U.S.C. 371 of International Application No. PCT/JP2014/001488 filed on Mar. 17, 2014 and published in Japanese as WO 2014/162668 A1 on Oct. 9, 2014. This application is based on and claims the benefit of priority from Japanese Patent Application No. 2013-076200 filed on Apr. 1, 2013, Japanese Patent Application No. 2013-076201 filed on Apr. 1, 2013, Japanese Patent Application No. 2013-076202 filed on Apr. 1, 2013, Japanese Patent Application No. 2013-076203 filed on Apr. 1, 2013 and Japanese Patent Application No. 2013-257240 filed on Dec. 12, 2013. The entire disclosures of all of the above applications are incorporated herein by reference.

TECHNICAL FIELD

The invention disclosed here relates to a capacitance-type switch on/off operated in correspondence with capacitance change caused by contact operation with an operating body.

BACKGROUND ART

Patent Literature 1 discloses a capacitance-type switch having an operation plate forming an operation surface contact-operated with a user's fingertip, and an electrode plate provided on the rear side of the operation plate. The capacitance-type switch is on/off operated in correspondence with capacitance change caused between the electrode plate and the finger tips.

Patent Literature 2 discloses a capacitance-type switch having an operation plate forming an operation surface, contact-operated with a user's fingertip, on its surface, and an electrode sheet attached to the rear surface of the operation plate. The electrode sheet is formed by evaporating electrodes and wirings onto a film having flexibility onto a film having flexibility. The electrodes are provided oppositely to the operation surface.

A detection signal, indicating the capacitance change caused between the fingertip and the electrode, is outputted through the wiring connected to the electrode to a determination circuit. The determination circuit determines based on the detection signal whether or not the operation surface has been contact-operated.

PRIOR ART LITERATURES

Patent Literature

[Patent Literature 1] JP-A 2008-305766
[Patent Literature 2] JP-A 2011-113893

SUMMARY

In this type of capacitance-type switch, when the electrode plate is provided close to the operation surface, there is a big difference between capacitance when the fingertip is in contact with the operation surface and that when the fingertip is not in contact with the operation surface. Accordingly, it is possible to improve switch sensitivity to on-operate the switch even when the fingertip is slightly in touch with the operation surface. However, the layout is limited when the electrode plate must be provided close to the operation surface. It is desired to improve the sensitivity while reduce such limitation.

Further, as described above, when the electrode plate is provided close to the operation surface so as to improve the sensitivity, there is a possibility of erroneous operation that the switch is on-operated even when the finger touches a part of the operation plate in the vicinity of the operation surface. Especially, when a plurality of operation surfaces are closely provided on the operation plate and the fingertip touches a desired operation surface, there is a possibility that capacitance changes greatly regarding an electrode plate opposite to an operation surface adjacent to the subject operation surface, to cause erroneous on-operation.

In the structure of the Patent Literature 2, it is necessary to attach the electrode sheet to the operation plate. This attaching work disturbs reduction of production cost. Especially, in a structure where the operation surface is transmission-illuminated by transmission of illumination light through the operation plate together with the electrode sheet, it is necessary to perform the attaching work not to cause bubbles in a contact surface between the electrode sheet and the operation plate. This requires much time and effort in the attaching work.

The invention disclosed here has been made in view of the above problems, and its object is to provide a capacitance-type switch with improved sensitivity and suppressed erroneous operation.

The invention disclosed here has been made in view of the problems, and its object is to provide a capacitance-type switch without necessity of electrode sheet attachment work.

To attain the above objects, one disclosed invention has the following technical means.

The invention to attain the objects has the following features. That is, it presupposes to provide a capacitance-type switch comprising: an operation plate forming an operation surface contact-operated with an operating body; and an electrode plate provided on the opposite side of the operation surface with respect to the operation plate, on/off-operated in correspondence with capacitance change caused between the operating body and the electrode plate. Further, it is characterized that a high-permittivity material having a high permittivity in comparison with that of the operation plate is provided in an outer peripheral portion of the electrode plate.

According to the invention, a line of electric force emanating from the opposite side of the operation surface in the electrode plate (rear surface of the electrode plate) is drawn to the high-permittivity material, and induced toward the operation surface. Accordingly, as the lines of electric force penetrating through the operation surface are increased, it is possible to improve the sensitivity.

The invention to attain the objects has the following features. That is, it presupposes to provide a capacitance-type switch comprising: an operation plate forming an operation surface contact-operated with an operating body; and an electrode plate provided on the opposite side of the operation surface with respect to the operation plate, on/off-operated in correspondence with capacitance change caused between the operating body and the electrode plate. Further, it is characterized that the operation plate is integrally formed by multi-color molding a plate-shaped substrate and a high-permittivity material having a high permittivity in comparison with that of the substrate, with resin. The high-permittivity material is provided in a projection range of the electrode plate.

The invention to attain the above objects has the following features. That is, it presupposes to provide a capacitance-type switch comprising: an operation plate forming an operation surface contact-operated with an operating body; and an electrode plate provided on the opposite side of the operation surface with respect to the operation plate, on/off-operated in correspondence with capacitance change caused between the operating body and the electrode plate. Further, it is characterized that the operation plate is provided with a plate-shaped substrate, and a high-permittivity material having a high permittivity in comparison with that of the substrate, provided on the surface of the substrate to form an operation surface.

The invention to attain the above objects has the following features. That is, it has an operation plate forming an operation surface contact-operated with an operating body, and an electrode plate provided on the opposite side of the operation surface with respect to the operation plate. Further, the invention has a determination circuit to determine whether or not the operation surface has been contact-operated in correspondence with capacitance change caused between the operating body and the electrode plate, and a wiring connected to the electrode plate, to output a signal to the determination circuit. The operation plate, the electrode plate and the wiring are integrally formed by multi-color molding with resin.

According to these features, since the electrode plate and the wiring are multi-color molded together with the operation plate, the electrode plate and the wiring are integrated with the operation plate. It is possible to omit work to attach the electrode plate and the wiring to the operation plate. Accordingly, it is possible to omit the conventionally-required attaching work of the electrode sheet, and reduce the production cost of the capacitance-type switch.

EMBODIMENTS FOR CARRYING OUT INVENTION

Figure 1:
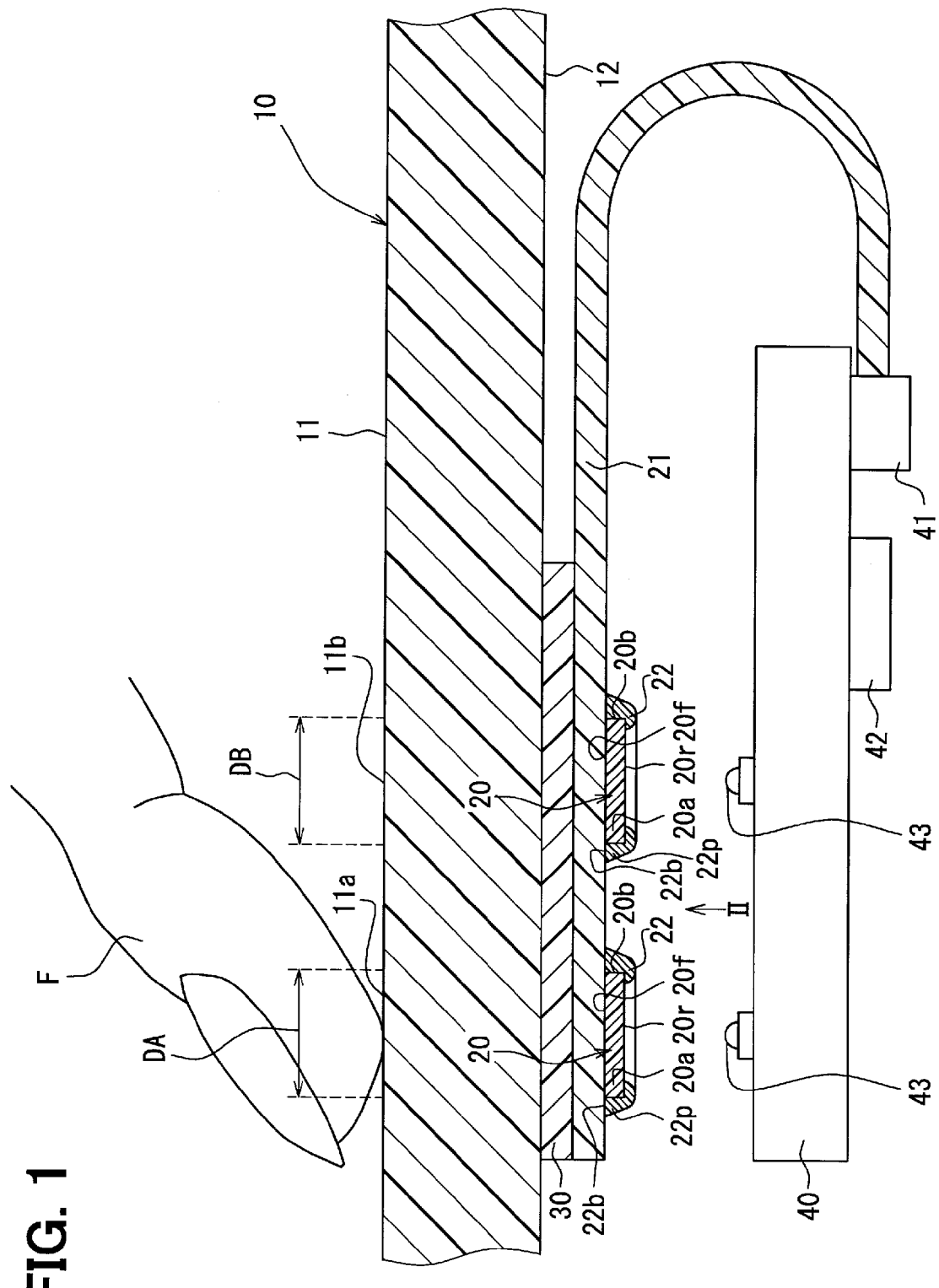
FIG. 1 is a general diagram of an capacitance-type switch according to a first embodiment and a I-I cross-sectional diagram of FIG. 2.

Hereinafter, embodiments for carrying out the invention will be described with reference to the drawings. Note that in the embodiments, corresponding constituent elements have the same reference numerals so as to omit overlapped explanations. Regarding the elements in the subsequent embodiments, the explanations of corresponding elements in the preceding embodiment(s) are to be referred to.

First Embodiment

An operation plate 10 shown in FIG. 1 has a plate shape formed with resin having translucency. As particular examples of resin material forming the operation plate 10, polycarbonate (PC), acrylic resin, and acrylonitrile-butadiene-styrene (ABS) are given. The surface of the operation plate 10 i.e. the user-side surface of the operation plate 10 is a design surface 11 recognized by a user. In the design surface 11, particular ranges DA, DB function as operation surfaces 11a, 11b. The operation surfaces 11a, 11b are contact-operated with the user's fingertip F (operating body). Characters and symbols indicating operation objects are printed on the operation surfaces 11a, 11b.

Three or more operation surfaces are closely arranged within a limited range on the design surface 11. FIG. 1 shows two operation surfaces 11a, 11b. Note that in the example of FIG. 1, in a direction where the two operation surfaces 11a, 11b are arrayed (horizontal direction in FIG. 1), the interval between the operation surfaces 11a, 11b is smaller than the length of the operation surfaces 11a, 11b.

Electrode plates 20 are provided on the opposite side of the design surface 11 with respect to the operation plate 10.

The electrode plate 20 has a sheet shape formed with resin having translucency. As particular examples of resin material forming the electrode plate 20, indium tin oxide (ITO) indium tin oxide and conductive polymers such as polyethylene dioxythiophene doped with polyethylene sulfonate (PEDOT-PSS) are given. The shape and size of the electrode plate 20 are the same as those of the operation surfaces 11a, 11b.

The electrode plate 20 is applied by evaporation or the like onto the rear surface of a film material 21, i.e., the opposite side surface of the film material 21 with respect to the operation plate 10. The film material 21 is formed with resin material having flexibility and translucency. As a particular example of the resin material, polyethylene terephthalate (PET) is given. The surface of the film material 21 is attached to a rear surface 12 of the operation plate 10 with an adhesive 30. That is, the electrode plate 20, being held with the film material 21 (holding member), is attached to the rear surface 12 of the operation plate 10.

The film material 21 is provided with a wiring (not shown). One end of the wiring is connected to the electrode plate 20. The other end of the wiring is connected to a connector 41 provided on a circuit board 40. In this configuration, a detection signal outputted from the electrode plate 20 is inputted into a microcomputer (microcomputer 42) mounted on the circuit board 40. The detection signal is a signal indicative of voltage change corresponding to capacitance change caused between the fingertip F and the electrode plate 20. Note that the electrode plate 20 is provided in correspondence with the respective a plurality of operation surfaces 11a, 11b. The detection signals outputted from the respective electrode plates 20 are inputted into the microcomputer 42.

The microcomputer 42 determines whether or not the fingertip F has comes into contact with the operation surfaces 11a, 11b based on change of the detection signal. When it determines that the fingertip has come into contact, it outputs an ON signal with respect to an operation object, to control the operation object to perform a desired operation. As particular examples of the operation object, activation, air volume setting, and temperature setting of an air conditioning device mounted on a vehicle, sound volume setting and music selection of an audio device mounted on the vehicle, and destination setting of a navigation device mounted on the vehicle, are given.

Further, as a particular example of the determination, when the detection signal has changed by a predetermined or greater value with respect to reference voltage, it is determined that the fingertip is in contact. In other words, in accordance with the principle of self-capacitance detection, when the capacitance has been increased by a predetermined or greater value, it is determined that the fingertip is in contact.

More specifically, when the fingertip F is not in contact with the operation surfaces 11a, 11b, parasitic capacitance occurs between a ground pattern of the circuit board 40 around the electrode plate 20 and the electrode plate 20. As a human body which is a conductor is grounded to a virtual ground, capacitance occurs between the electrode plate 20 and the fingertip F when the fingertip F approaches the operation surfaces 11a, 11b. The approach of the fingertip F (contact operation) is sensed by measuring the increment in the capacitance by the occurrence of capacitance between the electrode plate and the fingertip.

A light source 43 such as a light emitting diode is provided on the opposite side of the design surface 11 with respect to the electrode plate 20. The light source 43 is packaged on the front side of the circuit board 40. The light source 43 is provided oppositely to each electrode plate 20. Light emitted from the light source 43 is guided to the corresponding electrode plate 20 with a light guide member (not shown). The light is transmitted through the electrode plate 20, the film material 21, the adhesive 30, and the operation plate 10. As the light is transmitted through the corresponding operation surface of the operation surfaces 11a, 11b, it transmission-illuminates the operation surface. Note that in the design surface 11, coating material having a light shielding characteristic is printed on other portions than the operation surfaces 11a, 11b.

Figure 2:
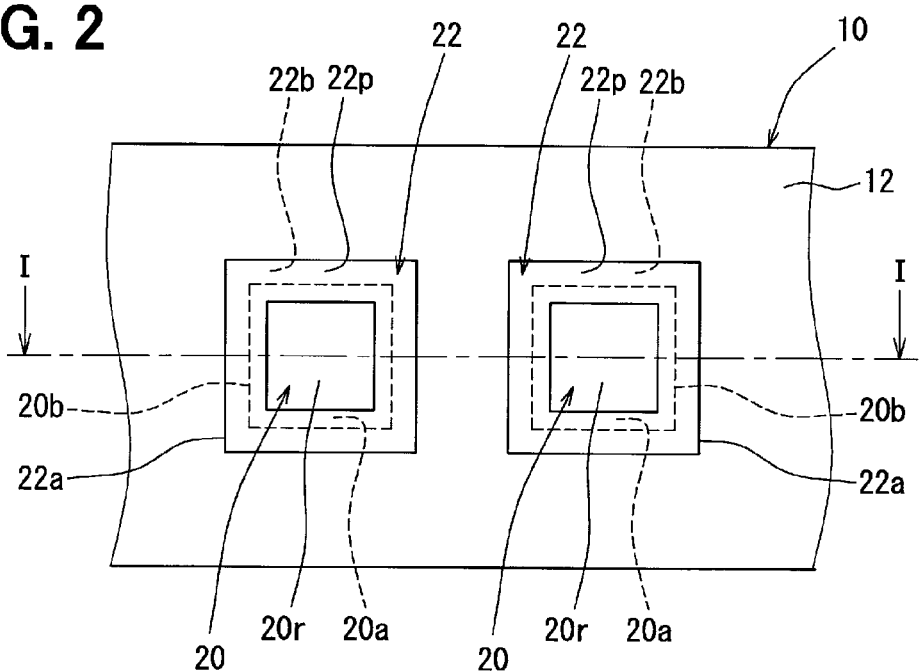
FIG. 2 is a II arrow diagram of FIG. 1.

In FIG. 2, the adhesive 30 and the film material 21 are omitted. As shown in FIG. 2, a high-permittivity material 22 formed with a material having high permittivity in comparison with that of the operation plate 10 is provided in an outer peripheral portion 20a of the electrode plate 20. More particularly, the high-permittivity material 22 is formed by mixing a material having permittivity higher than that of resin, e.g., glass filler or carbon filler, with resin such as polycarbonate, acrylic resin or ABS. Further, the permittivity of the high-permittivity material 22 is higher in comparison with that of the film material 21.

Further, the "outer peripheral portion 20a" is a rear surface 20r of the electrode plate 20. That is, it is a portion in a predetermined range adjacent to an outer peripheral end surface 20b of the electrode plate 20 in the opposite side surface of the design surface 11 in the electrode plate 20. Accordingly, the outer peripheral portion 20a of the electrode plate 20 has a ring shape. In the present embodiment, the high-permittivity material 22 is provided so as to cover the entire outer peripheral portion 20a. Note that the high-permittivity material 22 is not provided in a part at the center of the rear surface 20r of the electrode plate 20 and other than the outer peripheral portion 20a. In other words, the high-permittivity material 22 according to the present embodiment is formed in a ring shape.

Further, more specifically, the high-permittivity material 22 has an extending portion 22p extending in a direction away from the outer peripheral end surface 20b within a direction horizontal to the rear surface 20r of the electrode plate 20 (lateral direction in FIG. 1). In other words, an outer peripheral edge portion 22a of the high-permittivity material 22, viewed from a vertical direction to a plate surface of the electrode plate 20 as shown in FIG. 2, is positioned outside the outer peripheral end surface 20b of the electrode plate 20. Further, the high-permittivity material 22 has a shape covering the entire outer peripheral end surface 20b of the electrode plate 20.

Next, the operation obtained by providing the high-permittivity material 22 will be described using FIGS. 3 and 4. Note that dotted lines in FIG. 3 indicate distribution of lines of electric force when the high-permittivity material is omitted contrary to the present invention. The dotted lines in FIG. 4 indicate distribution of lines of electric force in the case of the present embodiment. As shown in the both figures, the lines of electric force emanating from the electrode plate 20 emanate from both of a surface 20f and the rear surface 20r. The lines of electric force emanating from the surface 20f arrive at the fingertip F which functions as an electrode via the film material 21, the adhesive 30 and the operation plate 10. On the other hand, a part of the lines of electric force emanating from the rear surface 20r move along a passage out into the air and toward the fingertip F.

Figure 3:
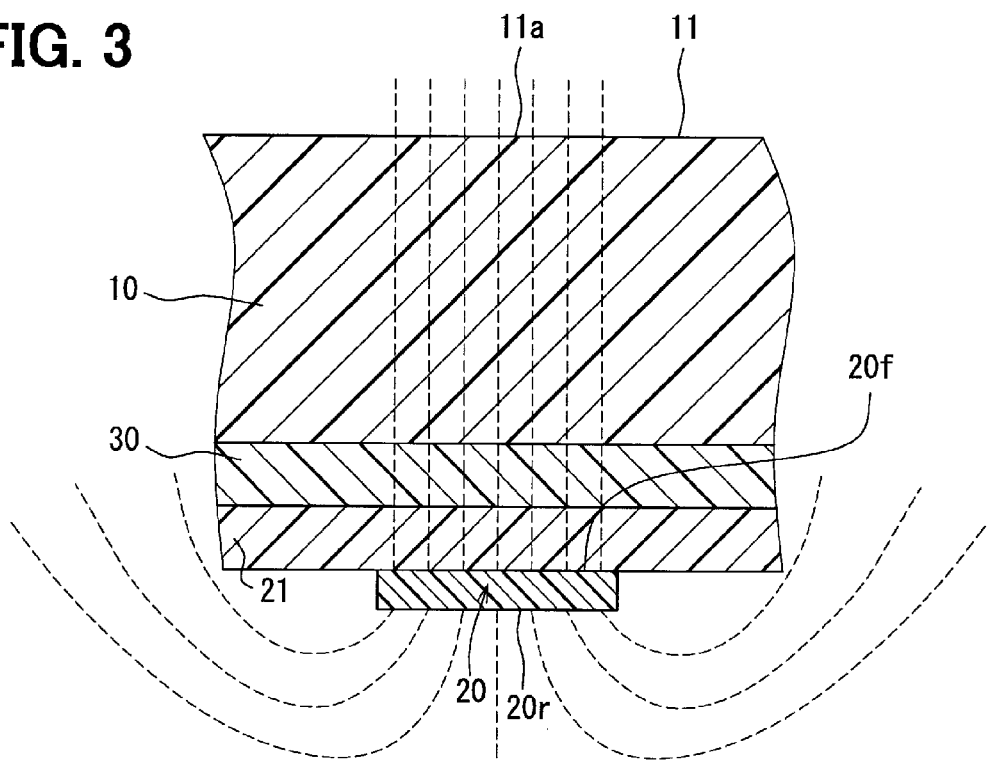
FIG. 3 is a diagram showing a comparative example.
Figure 4:
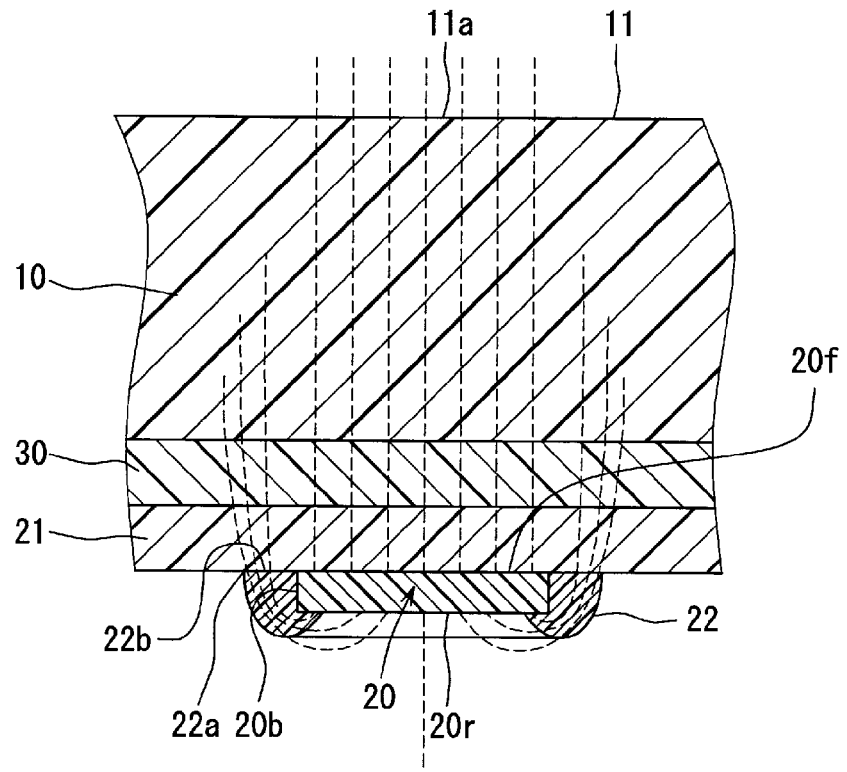
FIG. 4 illustrates distribution of lines of electric force emanating from the electrode plate.

In the air, since the permittivity is extremely low, when the high-permittivity material 22 is provided in the outer peripheral portion 20a of the electrode plate 20 as shown in FIG. 4, the lines of electric force in the air are strongly drawn to the high-permittivity material 22. Accordingly, when the lines of electric force emanating from the rear surface 20r are U-turned toward the fingertip F, the U-turn is promoted in FIG. 4 in comparison with the case in FIG. 3 where the high-permittivity material is omitted. Accordingly, the directivity of the lines of electric force emanating from the rear surface 20r toward the fingertip F in contact with the corresponding operation surface 11a is enhanced. Further, the number of lines of electric force to come to the fingertip F is increased.

As described above, according to the present embodiment, by providing the high-permittivity material 22 in the outer peripheral portion 20a of the electrode plate 20, the directivity of lines of electric force emanating from the rear surface 20r toward the corresponding operation surface 11a is enhanced. This suppresses change of the detection signal from the electrode plate 20 between the electrode plate and the fingertip in contact with the adjacent operation surface 11b. Accordingly, it is possible to suppress erroneous operation such as on-operation of the user's unintended operation object corresponding to an adjacent operation surface.

Further, as the number of lines of electric force arriving at the fingertip F in contact with the corresponding operation surface 11a is increased by the increase in the directivity as described above, it is possible to increase the change of detection signal from the electrode plate 20 caused upon contact between the fingertip F and the operation surface 11a. Accordingly, even with a slight touch on the operation surface 11a, i.e., even when a contact area between the fingertip F and the operation surface 11a is small, the detection signal changes by a predetermined or greater value with respect to reference voltage. Accordingly, it is possible to improve the switch sensitivity.

Further, in the present embodiment, the high-permittivity material 22, formed in a shape surrounding the electrode plate 20, is provided over the entire outer peripheral portion 20a. Accordingly, in comparison with a case where the high-permittivity material 22 is provided in only a part of the outer peripheral portion 20a, it is possible to increase the operation of the improvement in the directivity and the increase in the number of lines of electric force. Therefore it is possible to promote the effect of the suppression of erroneous operation and the improvement in the sensitivity.

Further, in the present embodiment, the high-permittivity material 22 has the extending portion 22p extending in a direction away from the outer peripheral end surface 20b of the electrode plate 20. As the electrode plate 20 is not positioned between the rear surface of the extending portion 22p i.e. an extending portion rear surface 22b shown in FIG. 4 and the fingertip F, it is possible to promote the movement of the lines of electric force emanating from the extending portion rear surface 22b linearly toward the fingertip F. Accordingly, it is possible to improve the directivity of the lines of electric force drawn to the high-permittivity material 22 toward the corresponding operation surface 11a. Therefore the effect of the suppression of erroneous operation is promoted.

Further, in the present embodiment, as the extending portion rear surface 22b is in contact with the film material 21, the lines of electric force emanating from the extending portion rear surface 22b arrive at the fingertip F through the film material 21, the adhesive 30 and the operation plate 10 without going into the air. Accordingly, it is possible to improve the density of the lines of electric force emanating from the extending portion rear surface 22b and arriving at the fingertip F. The effect of the suppression of erroneous operation and the improvement in the sensitivity is promoted.

Second Embodiment

Figure 5:
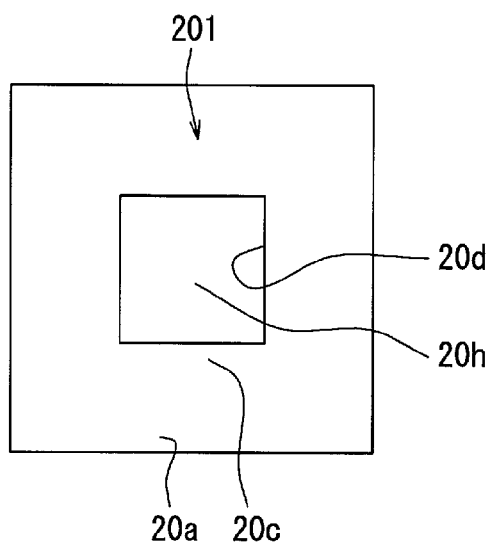
FIG. 5 is a plane diagram showing a single electrode plate according to a second embodiment.

In the present embodiment, the shape of the electrode plate 20 according to the first embodiment is deformed. In accordance with the deformation, the shape of the high-permittivity material 22 is also deformed. The other constituent elements are the same as those in the first embodiment. An electrode plate 201 according to the present embodiment shown in FIG. 5 has a shape where a through hole 20h is formed at the center. Accordingly, the electrode plate 201 has an inner peripheral portion 20c in addition to the outer peripheral portion 20a.

Figure 6:
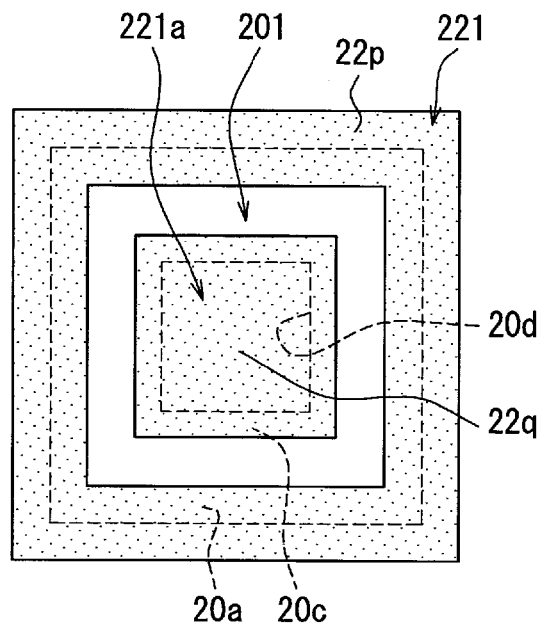
FIG. 6 is a plane diagram showing the electrode plate and a high-permittivity material according to the second embodiment, and is a VI arrow diagram of FIG. 7.

In FIG. 6, dot-patterned parts are high-permittivity materials 221, 221a. The shape and arrangement of the high-permittivity material 221 covering the outer peripheral portion 20a are the same as those of the high-permittivity material 22 according to the first embodiment. The high-permittivity material (inner high-permittivity material 221a) as a part covering the inner peripheral portion 20c is provided so as to cover the entire inner peripheral portion 20c and is formed in a ring shape along the inner peripheral portion 20c.

Figure 7:
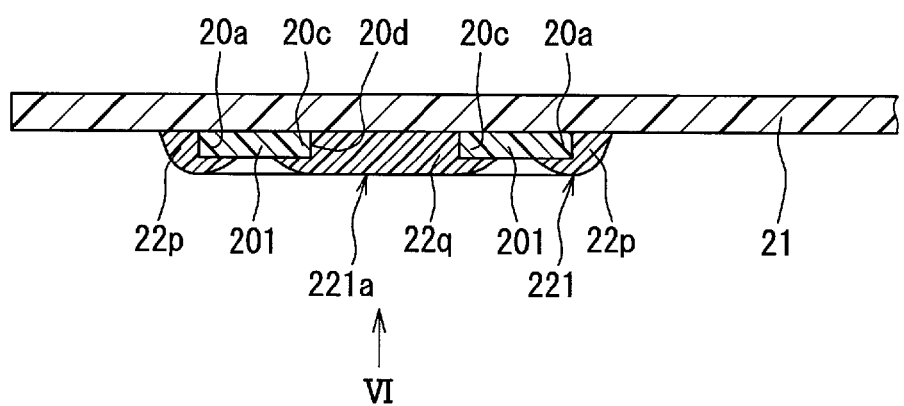
FIG. 7 is a cross-sectional diagram of the capacitance-type switch according to the second embodiment.

Further, more specifically, as shown in FIG. 7 in addition to FIG. 6, the inner high-permittivity material 221a has an extending portion 22q extending in a direction away from an inner peripheral end surface 20d of the electrode plate 201 within a direction horizontal to the rear surface 20r of the electrode plate 20. Further, the inner high-permittivity material 221a has a shape covering the entire inner peripheral end surface 20d of the electrode plate 20. The rear surface of the extending portion 22q is also in contact with the film material 21 as in the case of the extending portion rear surface 22b.

In this manner, in the case where the electrode plate 201 having the through hole 20h is used, according to the present embodiment, the high-permittivity material (inner high-permittivity material 221a) is also provided in the inner peripheral portion 20c of the electrode plate 201. Accordingly, a part of the lines of electric force in the air, emanated from the rear surface 20r, is drawn to the inner high-permittivity material 221a. Accordingly, it is possible to increase the operation of the improvement in the directivity and the increase in the number of lines of electric force. By extension, it is possible to promote the effect of the improvement in the directivity and the increase in the number of lines of electric force.

Third Embodiment

In the second embodiment shown in FIG. 6, the electrode plate 201 has a rectangular shape, and the outer peripheral portion 20a and the inner peripheral portion 20c of the electrode plate 201 have a rectangular shape. On the other hand, in the present embodiment shown in FIG. 8, an electrode plate 202 has a round shape (more specifically elliptical shape), and the outer peripheral portion 20a and the inner peripheral portion 20c of the electrode plate 202 have a round shape. Accordingly, an inner high-permittivity material 222a provided so as to cover the entire inner peripheral portion 20c has a round shape, and a high-permittivity material 222 provided so as to cover the entire outer peripheral portion 20a has a ring shape. Note that in FIG. 8, dot-patterned parts are the high-permittivity materials 222, 222a.

In this manner, even when the electrode plate 201 has a round shape, it is possible to provide the high-permittivity materials 222, 222a as in the case of the second embodiment. Further, it is possible to perform the same effect as that in the second embodiment.

Fourth Embodiment

In the respective embodiments, one electrode plate 20, 201, 202 is provided with respect to the operation surfaces 11a, 11b. On the other hand, in the present embodiment shown in FIG. 9, a plurality of electrode plates 203 are provided with respect to one operation surface. The electrode plates 203 are connected with high-permittivity material 223. Note that the high-permittivity material 22, 221 and 222 in the respective embodiments is provided so as to cover the entire outer peripheral portion 20a of the electrode plate 20, 201, 202. A high-permittivity material 223 in the present embodiment is provided so as to cover a part of the outer peripheral portion 20a.

Figure 9:
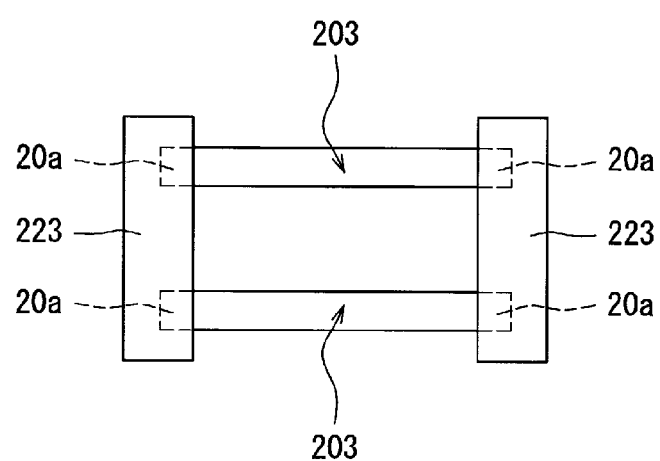
FIG. 9 is a plane diagram of the electrode plate viewed from the rear surface side in a fourth embodiment.

In this manner, even when a plurality of electrode plates 203 are provided with respect to one operation surface, it is possible to improve the directivity and increase the number of lines of electric force by providing the high-permittivity material 222, 222a as shown in FIG. 9. Accordingly, it is possible to perform the effect of the suppression of erroneous operation and the improvement of sensitivity.

Fifth Embodiment

Figure 8:
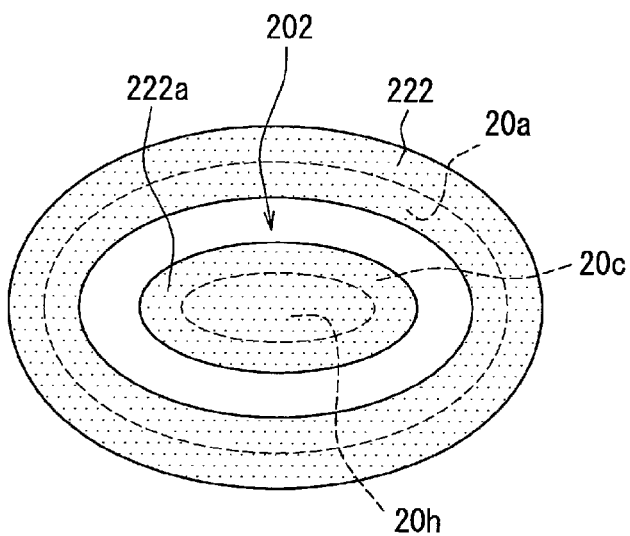
FIG. 8 is a plane diagram of the electrode plate viewed from the rear surface side in a third embodiment.

In the third embodiment shown in FIG. 8, the electrode plate 202 has a round shape including the through hole 20h. The high-permittivity material 222 is provided so as to cover the entire outer peripheral portion 20a of the electrode plate 202. On the other hand, in the present embodiment shown in FIG. 10, an electrode plate 204 has a round shape without through hole. A high-permittivity material 224 is provided so as to cover a part of the outer peripheral portion 20a of the electrode plate 204.

Figure 10:
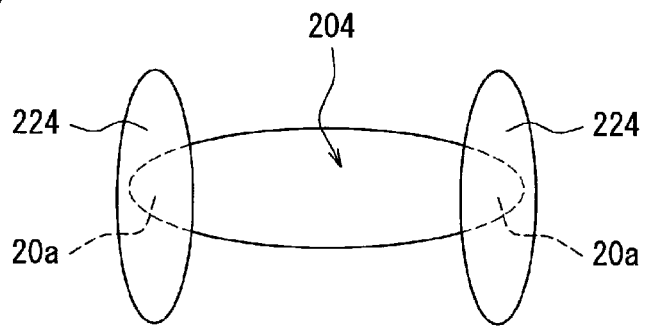
FIG. 10 is a plane diagram of the electrode plate viewed from the rear surface side in a fifth embodiment.

In this manner, even in the electrode plate 204 having the shape shown in FIG. 10, it is possible to improve the directivity and increase the number of lines of electric force by providing the high-permittivity material 224. It is possible to perform the effect of the suppression of erroneous operation and the improvement of sensitivity.

Sixth Embodiment

In the present embodiment shown in FIG. 11, a second high-permittivity material 14 described below is further added to the configuration of the first embodiment shown in FIG. 1.

The operation plate 10 according to the present embodiment has a plate-shaped substrate 13 and the second high-permittivity material 14. The substrate 13 is formed with resin such as ABS and has a plate shape. The second high-permittivity material 14 is formed with a material having high permittivity in comparison with that of the substrate 13 and having translucency. As the second high-permittivity material 14, resin material the same as that of the high-permittivity material 22.

The second high-permittivity material 14 is applied (by potting) to portions of the surface of the substrate 13 on the operation surface side, corresponding to the respective electrode plates 20. It rises from the flat-shaped design surface 11 toward the user side. In the first embodiment shown in FIG. 1, parts of the design surface 11 function as the operation surfaces 11a, 11b. On the other hand, in the present embodiment shown in FIG. 11, the surface of the second high-permittivity material 14 functions as the operation surfaces 11a, 11b. Note that characters and symbols indicating the operation objects are printed on the portion of the design surface 11 where the second high-permittivity material 14 is provided.

Further, the second high-permittivity material 14 is provided so as to cover the entire projection range 13a of the electrode plate 20 in the design surface 11. The "projection range 13a" is a range of the design surface 11 overlapped with the electrode plate 20 when the operation plate 10 is viewed from the rear surface 20r of the electrode plate 20 in a vertical direction with respect to the rear surface 20r. Accordingly, the shape and size of the projection range 13a are the same as those of the electrode plate 20. Note that in the example of FIG. 11, the second high-permittivity material 14 has the same shape and size as those of the electrode plate 20.

As described above, in the present embodiment, the second high-permittivity material 14 is provided on the design surface 11, and the surface of the second high-permittivity material 14 functions as the operation surfaces 11a, 11b. The lines of electric force emanating from the electrode plate 20 are drawn to the second high-permittivity material 14, and arrive at the fingertip F. It is possible to increase the number lines of electric force connecting the electrode plate 20 to the fingertip F, and improve the switch sensitivity. Further, among the lines of electric force emanating from the electrode plate 20, lines of electric force toward the operation surface 11b adjacent to the operation surface 11a corresponding to the electrode plate 20, are drawn to the second high-permittivity material 14 forming the operation surface 11a. As the directivity of the lines of electric force emanating from the rear surface 20r of the electrode plate 20 toward the fingertip F in contact with the corresponding operation surface 11a is enhanced, the effect of suppression of erroneous operation is promoted.

Further, in the present embodiment, the second high-permittivity material 14 is provided so as to cover the entire projection range 13a of the electrode plate 20 of the design surface 11. In comparison with the case where the high-permittivity material is provided so as to cover a part of the projection range 13a, it is possible to increase the effect of the improvement in the directivity and the increment in the number of the lines of electric force. Accordingly, the effect of the suppression of erroneous operation and the improvement in the sensitivity is promoted.

Further, in the present embodiment, the second high-permittivity material 14 is applied to a portion of the surface of the substrate 13 on the operation surface side (design surface 11) corresponding to each electrode plate 20, and it is raised from the flat-shaped design surface 11 toward the user side. Accordingly, the user who touches the second high-permittivity material 14 with his/her fingertip F perceives by touch that the portion in contact with the fingertip F is the operation surfaces 11a, 11b. This enables blind operation.

Seventh Embodiment

In the present embodiment shown in FIG. 12, Third high-permittivity materials 15, 16 and a low-permittivity material 17 described below are further added to the configuration of the first embodiment shown in FIG. 1.

The operation plate 10 according to the present embodiment has the plate-shaped substrate 13, the third high-permittivity materials 15, 16, and the low-permittivity material 17. The substrate 13 has a plate shape formed with resin such as ABS. The third high-permittivity materials 15, 16 are formed with a material having high permittivity in comparison with that of the substrate 13 and having translucency. As the third high-permittivity materials 15, 16, the same resin material as that of the high-permittivity material 22 is used. The low-permittivity material 17 is formed with a material having low permittivity in comparison with that of the substrate 13.

Further, the third high-permittivity materials 15, 16, the low-permittivity material 17 and the substrate 13 are integrally formed by multi-color molding with resin. The multi-color molding is a method of combining different qualities (materials) and integrally molding them. More particularly, molten resin is injected to a part of a die to be the substrate 13 and molded in the die, thereafter, molten resin for the third high-permittivity materials 15, 16 and the low-permittivity material 17 is injected in the same die where the substrate 13 remains. With this arrangement, the third high-permittivity materials 15, 16, the low-permittivity material 17 and the substrate 13 as different qualities of materials are integrally resin-molded.

The third high-permittivity materials 15, 16 are provided so as to cover the entire projection range 13a of the electrode plate 20 in the operation plate 10. The "projection range 13a" is a range overlapped with the electrode plate 20 when the operation plate 10 is viewed from the rear surface 20r of the electrode plate 20 in a vertical direction with respect to the rear surface 20r. Accordingly, the shape and size of the projection range 13a are the same as those of the electrode plate 20. Note that in the example of FIG. 12, the third high-permittivity materials 15, 16 have the same shape and size as those of the electrode plate 20.

The shown one third high-permittivity material 15 is provided entirely through the substrate 13 in the plate thickness direction. The shown other third high-permittivity material 16 is provided not to be exposed on the surface of the operation plate 10 on the side where the design surface 11 is formed. Accordingly, the operation surface 11a corresponding to the one third high-permittivity material 15 is formed with the surface of the third high-permittivity material 16. The operation surface 11b corresponding to the other third high-permittivity material 16 is formed with the surface of the substrate 13. Note that the low-permittivity material 17 is provided between the adjacent third high-permittivity materials 15, 16 in the operation plate 10, and provided entirely through the substrate 13 in the plate thickness direction.

According to the present embodiment described above, the operation plate 10 is integrally formed by multi-color molding the third high-permittivity materials 15, 16 and the substrate 13, and the third high-permittivity materials 15, 16 are provided in the projection range 13a of the electrode plate 20. Accordingly, the lines of electric force emanating from the electrode plate 20 are drawn to the third high-permittivity materials 15, 16, and arrive at the fingertip F. It is possible to increase the number of lines of electric force connecting the electrode plate 20 to the fingertip F, and improve the switch sensitivity. Further, among the lines of electric force emanating from the electrode plate 20, lines of electric force toward the operation surface 11b adjacent to the operation surface 11a corresponding to the electrode plate 20 are drawn to the third high-permittivity material 15 provided in the projection range 13a of the electrode plate 20. The directivity of the lines of electric force emanating from the rear surface 20r of the electrode plate 20 toward the fingertip F in contact with the corresponding operation surface 11a is enhanced. Accordingly, it is possible to promote the effect of the suppression of erroneous operation.

Further, in the present embodiment, in addition to the third high-permittivity materials 15, 16, the low-permittivity material 17 is also formed by multi-color molding. The low-permittivity material 17 is provided between the adjacent third high-permittivity materials 15, 16. Accordingly, it is possible to promote enhancement of the directivity of the lines of electric force emanating from the electrode plate 20 toward the desired operation surface 11a.

Further, in the present embodiment, the one third high-permittivity material 15 is provided entirely through the substrate 13 in the plate thickness direction. Accordingly, in comparison with a case where the third high-permittivity material is provided partially through the substrate 13 in the plate thickness direction, it is possible to promote enhancement of the directivity of the lines of electric force emanating from the electrode plate 20 toward the desired operation surface 11a.

Further, in the present embodiment, the other third high-permittivity material 16 is provided not to be exposed on the surface of the operation plate 10 on the side where the operation surface 11 is formed (design surface 11). Accordingly, as the boundary line between the third high-permittivity material 16 and the substrate 13 is not exposed on the design surface 11, it is possible to improve the appearance of the design surface 11.

Eighth Embodiment

Figure 13:
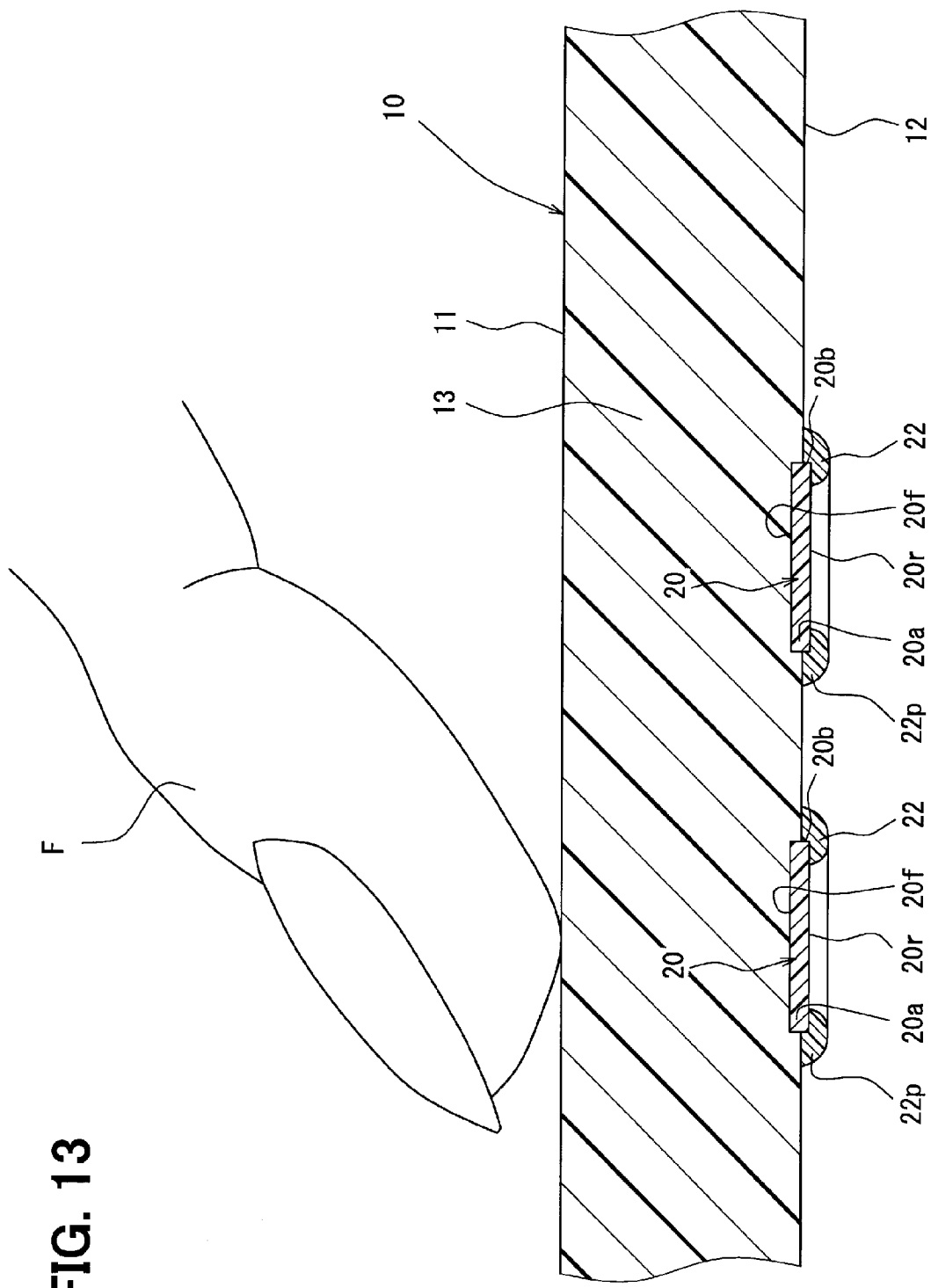
FIG. 13 is a cross-sectional diagram of the capacitance-type switch according to an eighth embodiment.

In the respective embodiments, the electrode plate 20 is applied to the film material 21, and the film material 21 is attached to the operation plate 10. In other words, the electrode plate 20 is attached via the film material 21 to the operation plate 10. On the other hand, in the present embodiment, as shown in FIG. 13, the electrode plate 20 is directly attached to the operation plate 10.

More specifically, the electrode plate 20 is applied to the operation plate 10, and the high-permittivity material 22 is applied over the applied electrode plate 20. With this configuration, the high-permittivity material 22 is provided on the outer peripheral portion a of the electrode plate 20. Further, the rear surface of the extending portion 22p of the high-permittivity material 22 is in contact with the operation plate 10.

In this manner, even when the electrode plate 20 is directly attached to the operation plate 10, the high-permittivity material 22 is provided as in the case of the first embodiment. It is possible to perform the same effect as that of the first embodiment.

Ninth Embodiment

Figure 14:
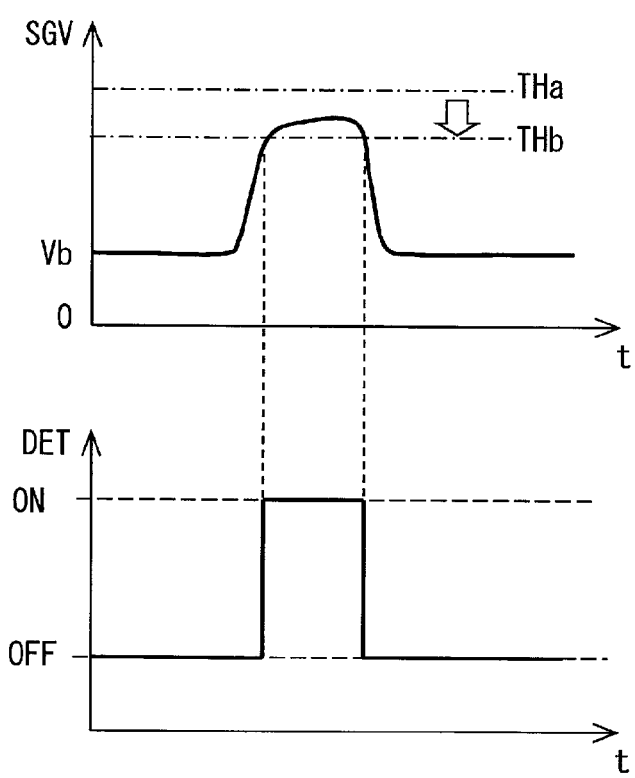
FIG. 14 is a waveform diagram when switch sensitivity is raised in a ninth embodiment.
Figure 15:
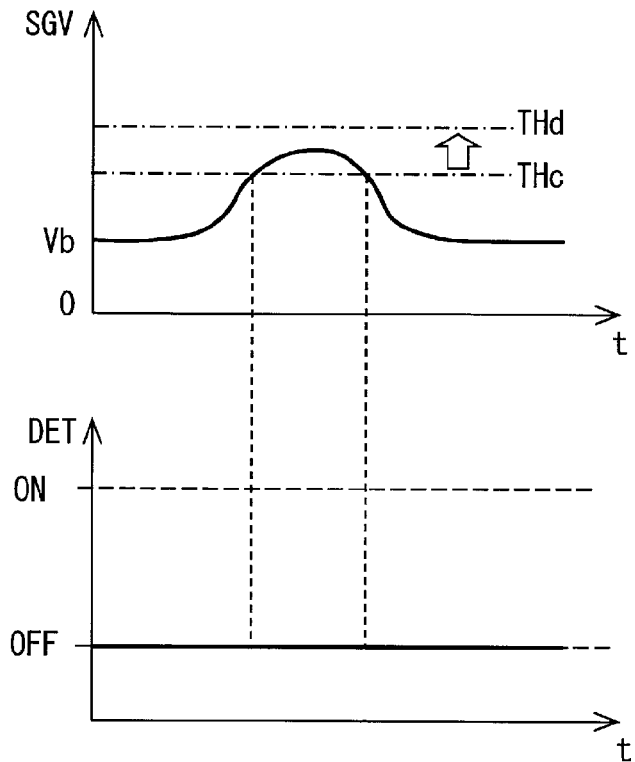
FIG. 15 is a waveform diagram when the switch sensitivity is lowered in the ninth embodiment.

In FIGS. 14 and 15, an upper part indicates a voltage value of the detection signal outputted from the electrode plate 20 (signal intensity SGV). A lower part indicates determination DET with the microcomputer 42. A lateral axis indicates time t. When the signal intensity exceeds threshold values THa, THb, THc and THd, the determination with the microcomputer 42 is ON as indicated with a middle part of the figures. That is, when the corresponding operation surfaces 11a, 11b are contact-operated, the microcomputer 42 determines the operation surface is in contact with the fingertip. FIG. 14 shows a waveform of signal intensity when the fingertip F is in contact with the operation surfaces 11a, 11b. FIG. 15 shows a waveform of signal intensity when the fingertip F is moved, not into contact with, but closer to the operation surfaces 11a, 11b. For example, when an adjacently-positioned operation surface is contact-operated, this waveform appears.

Note that as described above, when the detection signal is changed by a predetermined or greater value with respect to reference voltage, the determination result is ON. In FIGS. 14 and 15, reference numeral Vb denotes a signal intensity value (base value) when the fingertip F is not close to the operation surfaces 11a, 11b. The threshold values THa, THb, THc and THd are values with reference to the base value Vb.

In the waveform in FIG. 14, as the setting of the threshold value denoted by reference numeral THa is too high, the signal intensity does not exceed the threshold value THa even when contact operation is performed, and ON determination is not made. For example, when a user having a small fingertip area or a user having dry skin performs contact operation, the signal intensity does not rise without difficulty, and the above inconvenience easily occurs. In this case, it is necessary to perform control to lower the setting of the threshold value. For example, when the setting is lowered to a value denoted by reference numeral THb, normal ON determination is made as shown with the lower part of FIG. 14.

In the waveform in FIG. 15, as the setting of the threshold value denoted by reference numeral THc is too low, the signal intensity exceeds the threshold value THc even when contact operation is not performed, and ON determination is made. For example, when a user having a large fingertip area or a user who sweats a lot moves his/her fingertip F closer to the operation surface, the signal intensity easily rises, and the above inconvenience easily occurs. In this case, it is necessary to perform control to raise the setting of the threshold value. For example, when the setting is raised to a threshold value denoted by reference numeral THd, normal OFF determination is maintained as shown with the lower part of FIG. 15.

In view of the necessary of the above control, the microcomputer 42 according to the present embodiment has a function of enabling the operator such as a user to control the threshold value. More particularly, when the operation surfaces 11a, 11b are operated with a previously set pattern, the switch enters a control mode status capable of control. As a particular example of the above pattern, simultaneous contact operation of a predetermined combination of operation surfaces among the operation surfaces 11a, 11b is given.

In the control mode, one of the operation surfaces 11a, 11b functions as a switch to raise the threshold value, while the other one functions as a switch to lower the threshold value. Accordingly, the operator can control the threshold value by operating these switches.

In this manner, according to the present embodiment, as the microcomputer 42 has a function of controlling the threshold value, it is possible to control the switch sensitivity in correspondence with wetness of the user's fingertip or fingertip area. Accordingly, it is possible to reduce occurrence of inconvenience when ON determination is not made due to insufficient sensitivity even though contact operation is performed, or when ON determination is made due to excessive sensitivity even though contact operation is not performed.

Tenth Embodiment

Figure 16:
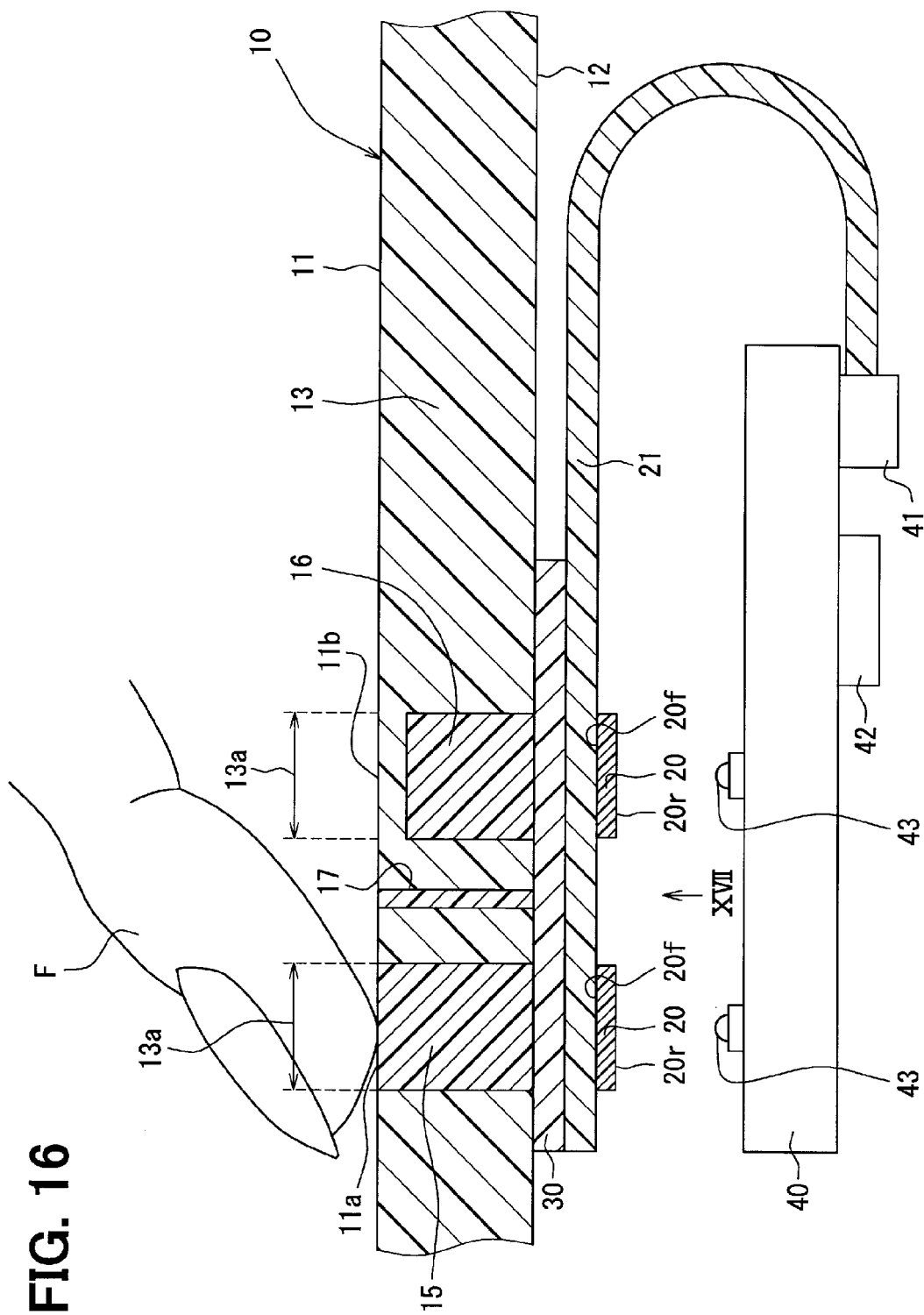
FIG. 16 is a general diagram of the capacitance-type switch according to a tenth embodiment and is a XVI-XVI cross-sectional diagram of FIG. 17.

The operation plate 10 shown in FIG. 16 has the plate-shaped substrate 13, the high-permittivity materials 15, 16, and the low-permittivity material 17. The substrate 13 has a plate shape formed with resin having translucency. The surface of the substrate 13, i.e., the surface of the substrate 13 on the user side is the design surface 11 recognized by the user.

Figure 17:
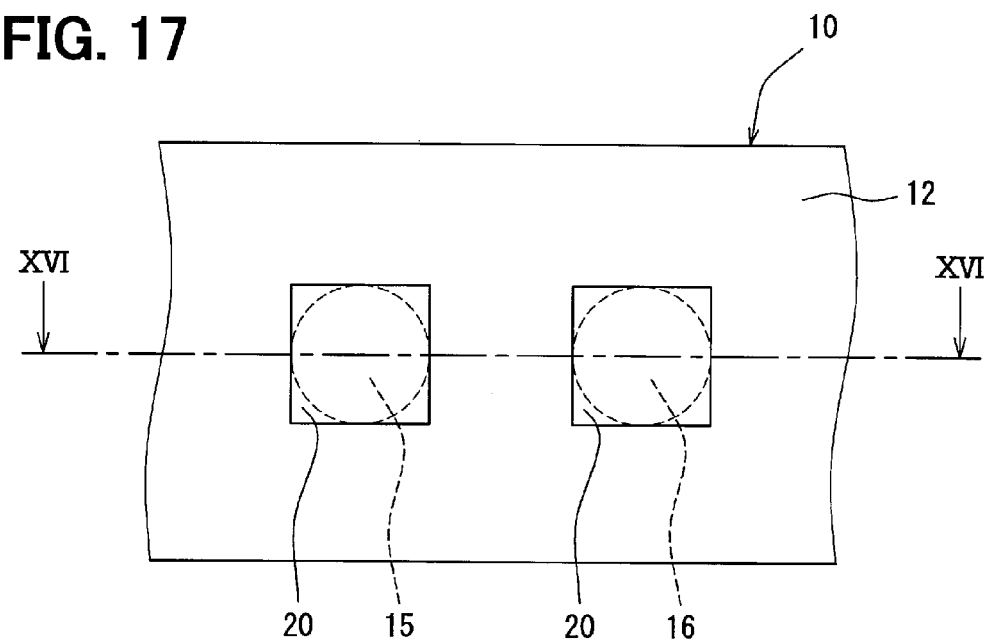
FIG. 17 is a XVII arrow diagram of FIG. 16.
Figure 18:
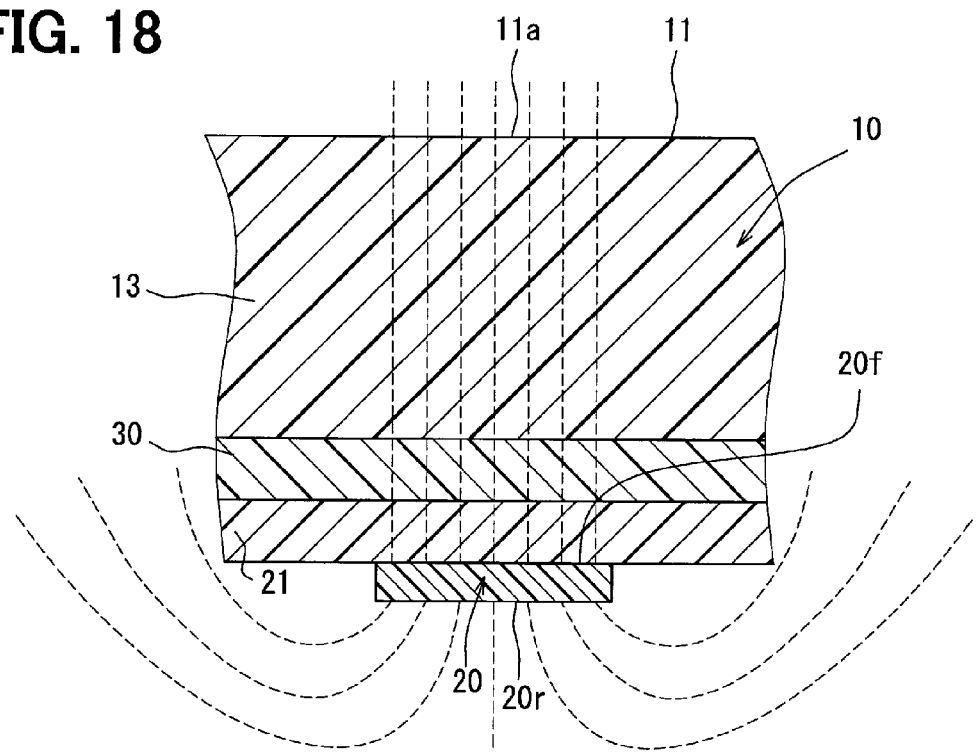
FIG. 18 is a diagram showing a comparative example.
Figure 19:
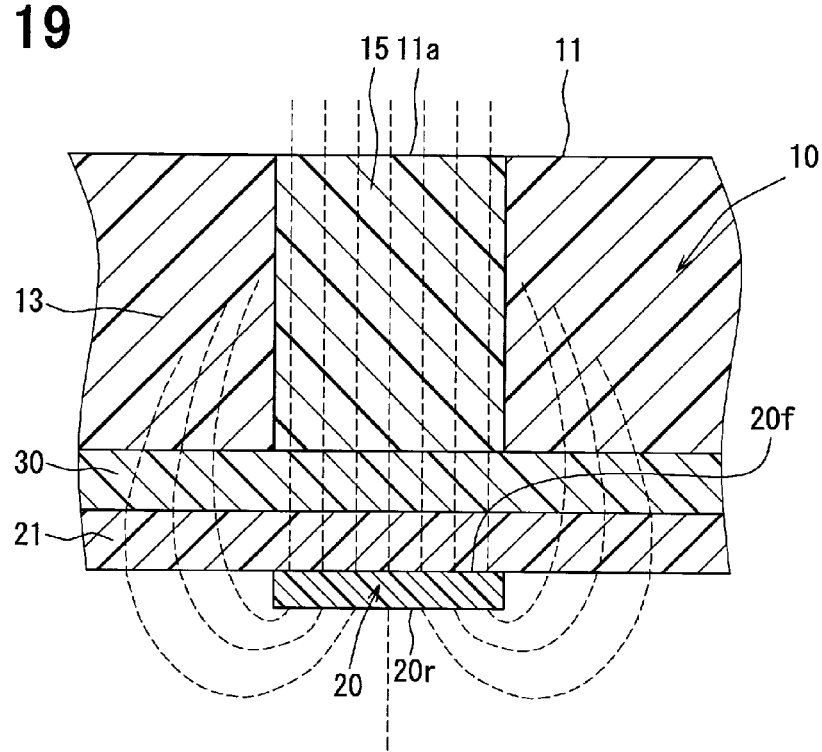
FIG. 19 is a diagram showing the distribution of lines of electric force emanating from the electrode plate.

In FIG. 17, illustration of the adhesive 30 and the film material 21 are omitted. The electrode plate 20 has a rectangular shape, and the high-permittivity materials 15, 16 have a round shape. The high-permittivity materials 15, 16 are provided so as to be overlapped with the projection range 13a of the electrode plate 20. The "projection range 13a" is a range in the design surface 11 overlapped with the electrode plate 20 when the operation plate 10 is viewed from the rear surface 20r of the electrode plate 20 in a vertical direction with respect to the rear surface 20r. FIGS. 18 and 19 respectively correspond to FIGS. 3 and 4. When the high-permittivity material 15 is provided on the design surface 11, the lines of electric force in the air are strongly drawn to the high-permittivity material 15. Accordingly, when the lines of electric force emanating from the rear surface 20r are U-turned toward the fingertip F, in comparison with the case of FIG. 18 where the high-permittivity material is omitted, the U-turn is promoted in the case of FIG. 19. Accordingly, the directivity of the lines of electric force emanating from the rear surface 20r toward the fingertip F in contact with the corresponding operation surface 11a is enhanced. Further, the number of lines of electric force come to the fingertip F is increased. According to the present embodiment, it is possible to suppress erroneous operation by providing the high-permittivity materials 15, 16 in the projection range 13a of the electrode plate 20. Further, it is possible to improve the switch sensitivity.

Further, in the present embodiment, in addition to the high-permittivity materials 15, 16, the low-permittivity material 17 is also multi-color molded, and the low-permittivity material 17 is provided between the adjacent high-permittivity materials 15, 16. Accordingly, it is possible to promote enhancement of the directivity of the lines of electric force emanating from the electrode plate 20 toward a desired operation surface 11a.

Further, in the present embodiment, the one high-permittivity material 15 is provided entirely through the substrate 13 in the plate thickness direction. Accordingly, in comparison with a case where it is partially provided in the plate thickness direction, it is possible to promote enhancement of the directivity of the lines of electric force emanating from the electrode plate 20 toward the desired operation surface 11a.

Further, in the present embodiment, the other high-permittivity material 16 is provided not to be exposed on the surface of the operation plate 10 on the side where the operation surface is formed (design surface 11). Accordingly, as the boundary between the high-permittivity material 16 and the substrate 13 is not exposed on the design surface 11, it is possible to improve the appearance of the design surface 11.

Eleventh Embodiment

Figure 20:
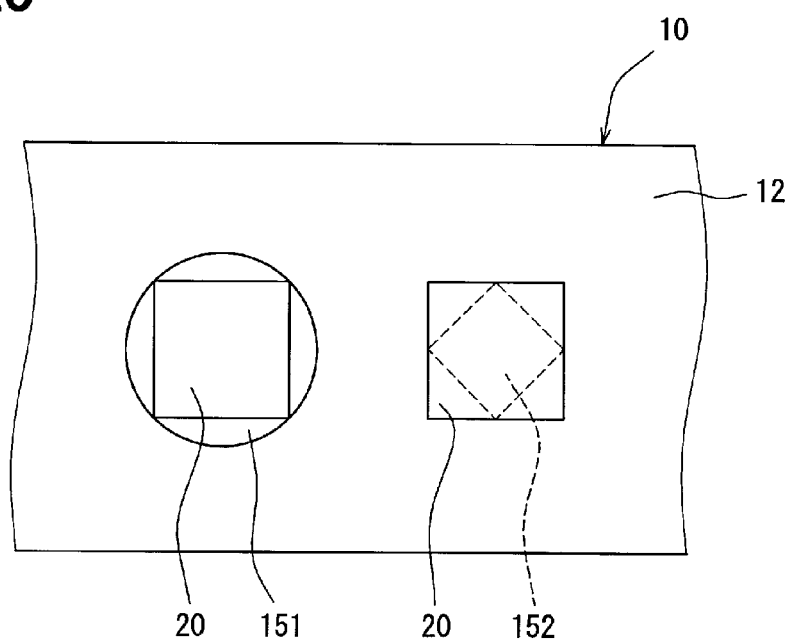
FIG. 20 is a plane diagram of the electrode plate viewed from the rear surface side in an eleventh embodiment.

In the tenth embodiment, the high-permittivity materials 15, 16 are provided so as to be overlapped with the projection range 13a of the electrode plate 20. On the other hand, in the present embodiment shown in FIG. 20, a high-permittivity material 151 shown in the left side part of the figure is provided so as to cover the entire projection range 13a of the electrode plate 20.

In this manner, as the high-permittivity material 151 is provided so as to cover the entire projection range 13a of the electrode plate 20, in comparison with a case where it is provided so as to cover a part of the projection range 13a, it is possible to increase the effect of the improvement of directivity and the increment in the number of lines of electric force. Accordingly, it is possible to promote the effect of the suppression of erroneous operation and the increment in the number of lines.

Note that the high-permittivity material 151 has a round shape, whereas a high-permittivity material 152 shown in a right side part of the figure has a rectangular shape. In this manner, the shape of the high-permittivity materials 15, 151, 152 is not limited to a round shape as long as they are provided so as to be overlapped with at least a part of the projection range 13a.

Twelfth Embodiment

Figure 21:
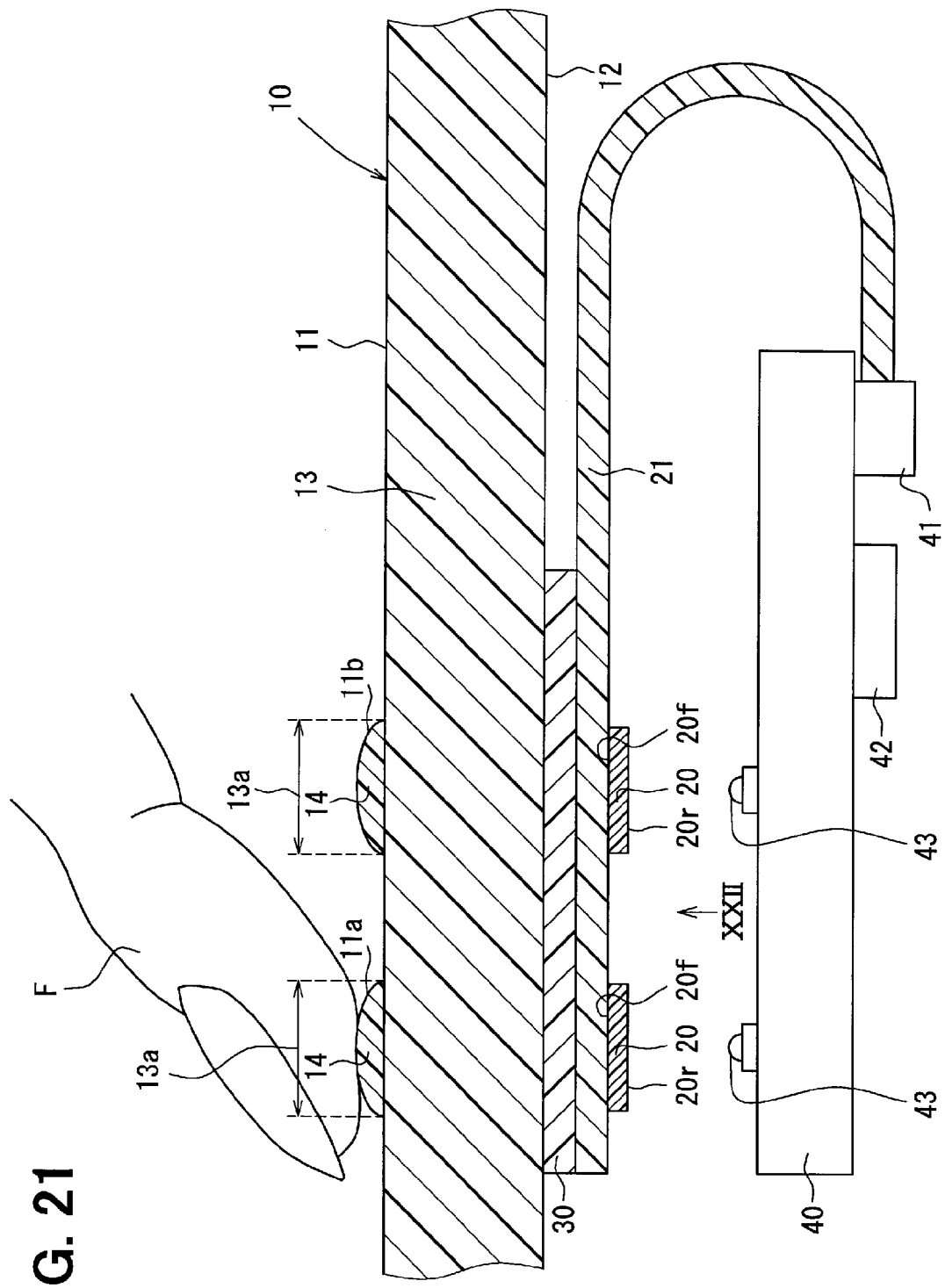
FIG. 21 is a general diagram of the capacitance-type switch according to a twelfth embodiment and is a XXI-XXI cross-sectional diagram of FIG. 22.

The operation plate 10 shown in FIG. 21 has the plate-shaped substrate 13 and the high-permittivity material 14. The high-permittivity material 14 is applied (by potting) in a particular range of the surface of the substrate 13 on the operation surface side (design surface 11). It is raised from the flat-shaped design surface 11 toward the user side. The surface of the high-permittivity material 14 functions as the operation surfaces 11a, 11b. The operation surfaces 11a, 11b are contact-operated with the user's fingertip F (operating body). Characters and symbols indicating operation objects are printed on the operation surfaces 11a, 11b. Note that the characters and symbols indicating the operation objects are printed on the portion of the design surface 11 where the second high-permittivity material 14 is provided.

Figure 22:
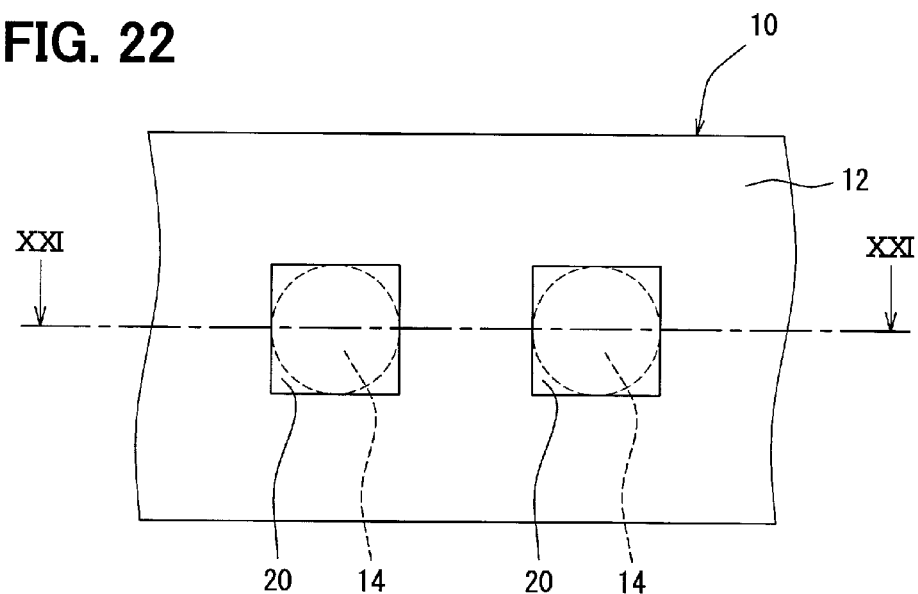
FIG. 22 is a XXII arrow diagram of FIG. 21.

In FIG. 22, the high-permittivity material 14 is provided so as to cover a part of the projection range 13a of the electrode plate 20 in the design surface 11.

Figure 23:
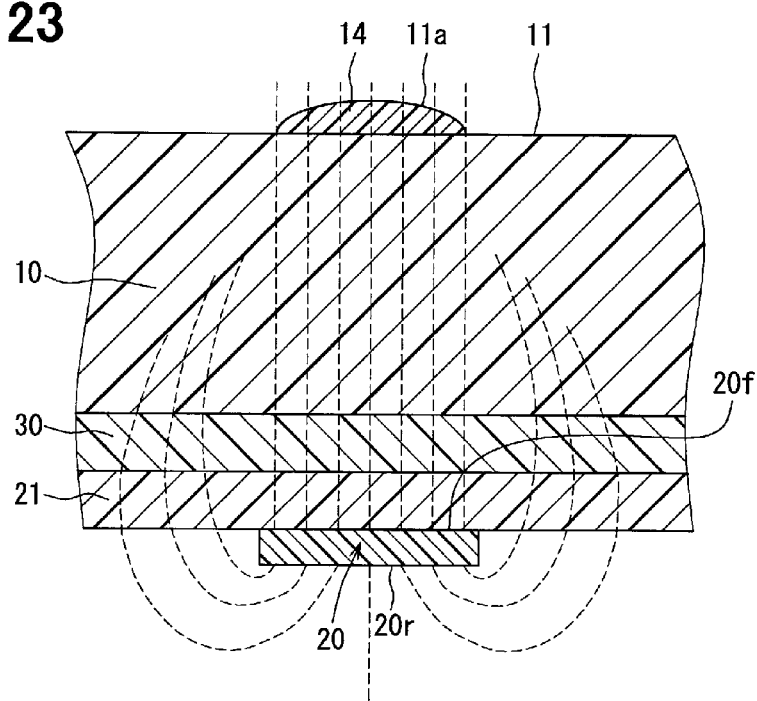
FIG. 23 is a diagram showing the distribution of lines of electric force emanating from the electrode plate.

FIG. 23 corresponds to FIG. 4. When the high-permittivity material 14 is provided on the design surface 11, the lines of electric force in the air are strongly drawn to the high-permittivity material 14 and the U-turn is promoted. According to the present embodiment, it is possible to suppress erroneous operation by providing the high-permittivity material 14 in the projection range 13a of the electrode plate 20 in the design surface 11. Further, it is possible to improve the switch sensitivity.

Thirteenth Embodiment

Figure 24:
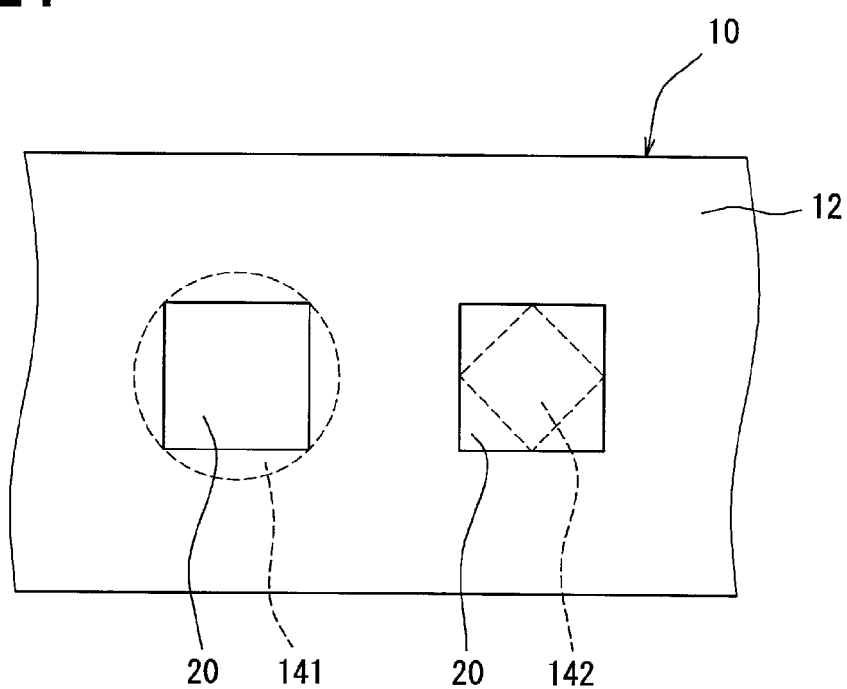
FIG. 24 is a plane diagram of the electrode plate viewed from the rear surface side in a thirteenth embodiment.

In the twelfth embodiment, the high-permittivity material 14 is provided so as to cover a part of the projection range 13a of the electrode plate 20 in the design surface 11. On the other hand, in the present embodiment shown in FIG. 24, a high-permittivity material 141 shown in a left side part of the figure is provided so as to cover the entire projection range 13a of the electrode plate 20 in the design surface 11.

In this manner, as the high-permittivity material 14 is provided so as to cover the entire projection range 13a of the electrode plate 20 in the design surface 11, in comparison with a case where it is provided so as to cover a part of the projection range 13a, it is possible to increase the effect of the improvement in the directivity and the increment in the number of lines of electric force. Accordingly, it is possible to promote the effect of the suppression of erroneous operation and the improvement in the sensitivity.

Note that the high-permittivity material 141 has a round shape, whereas a high-permittivity material 142 shown in a right side part of the figure has a rectangular shape. In this manner, the shape of the high-permittivity materials 14, 141, 142 is not limited to a round shape as long as they are provided so as to cover at least a part of the projection range 13a.

Fourteenth Embodiment

In the present embodiment shown in FIG. 25, second high-permittivity materials 15, 16 to be described below and the low-permittivity material 17 are further added to the configuration in the twelfth embodiment.

The operation plate 10 according to the present embodiment has the plate-shaped substrate 13, the high-permittivity material 14, the second high-permittivity materials 15, 16, and the low-permittivity material 17. The second high-permittivity materials 15, 16 are formed with a material having high permittivity in comparison with that of the substrate 13 and having translucency. As the second high-permittivity materials 15, 16, the same resin material as that of the high-permittivity material 14 is used. The low-permittivity material 17 is formed with a material having low permittivity in comparison with that of the substrate 13.

Further, the second high-permittivity materials 15, 16, the low-permittivity material 17 and the substrate 13 are integrally formed by multi-color molding, with resin. The multi-color molding is a method of combining different qualities (materials) and integrally molding them. More particularly, molten resin is injected to a part of a die to be the substrate 13 and molded in the die, thereafter, molten resin for the second high-permittivity materials 14, 15 and the low-permittivity material 17 is injected in the same die where the substrate 13 remains. With this arrangement, the second high-permittivity materials 15, 16, the low-permittivity material 17 and the substrate 13 as different qualities of materials are integrally resin-molded.

The second high-permittivity materials 15, 16 are provided so as to cover the entire projection range 13a of the electrode plate 20 in the operation plate 10. Note that in the example of FIG. 25, the second high-permittivity materials 15, 16 have the same shape and size as those of the electrode plate 20.

According to the present embodiment described above, the effect of the suppression of erroneous operation is promoted. Further, in the present embodiment, it is possible to promote enhancement of directivity. Further, in the present embodiment, it is possible to improve the appearance of the design surface 11.

Fifteenth Embodiment

Figure 26:
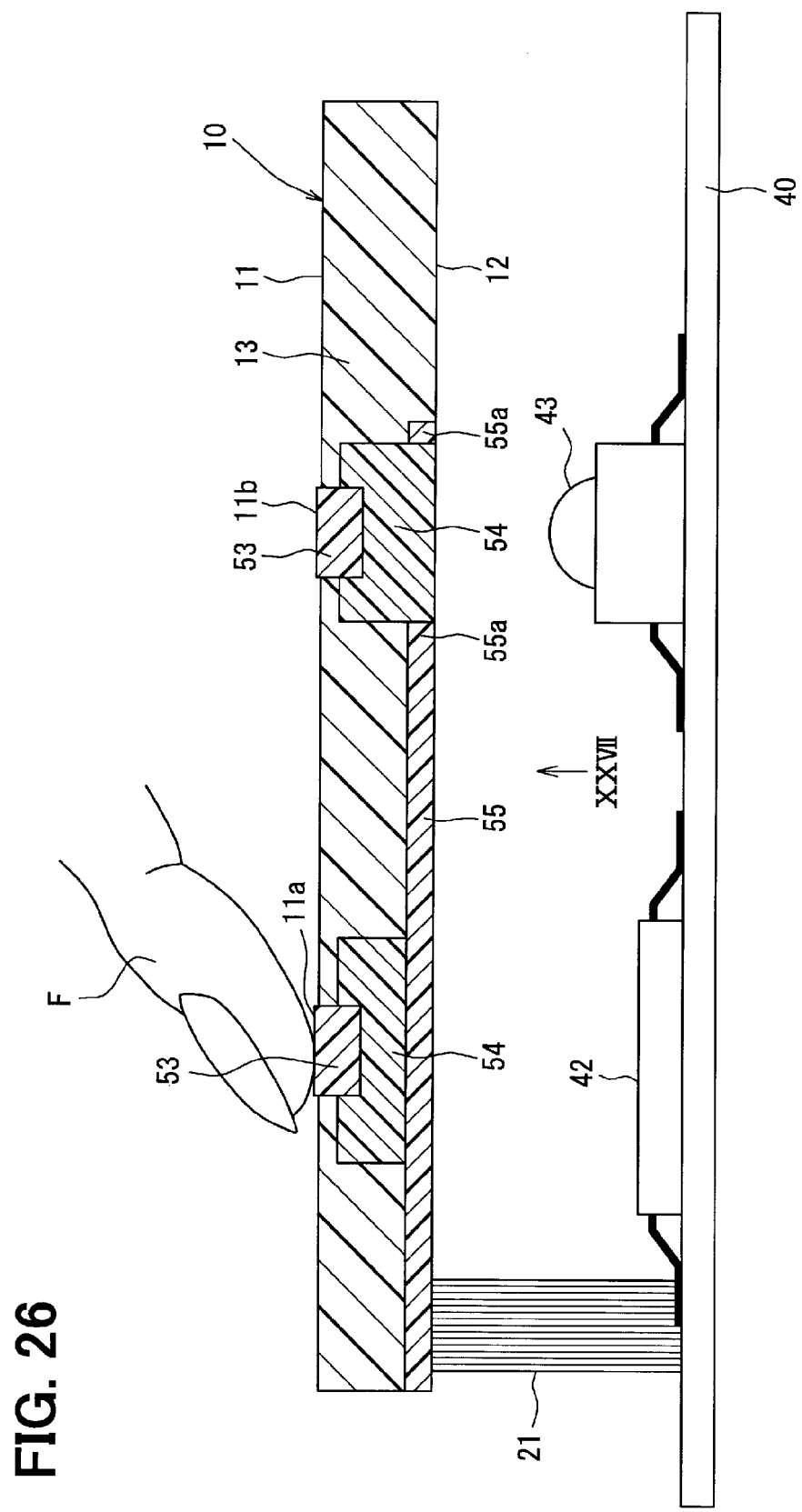
FIG. 26 is a general diagram of the capacitance-type switch according to a fifteenth embodiment and is a XXVI-XXVI cross-sectional diagram of FIG. 27.

The operation plate 10 shown in FIG. 26 has the plate-shaped substrate 13 and an operation section 53 formed with resin having translucency. As particular examples of the resin material for these parts, PC (polycarbonate), acrylic resin, and ABS (acrylonitrile-butadiene-styrene) are given. The substrate 13 and the operation section 53 are integrally formed by multi-color molding with resin. Note that as the substrate 13, it is not necessary to use a material having translucency. When material having translucency is used, it is desirable to print coating material having a light shielding characteristic.

The operation plate 10 is provided with electrode plates 54. The electrode plate 54 is formed with a material having translucency and having high permittivity in comparison with that of the substrate 13. As a particular example of the material forming the electrode plate 54, a mixture of a material having conductivity (e.g. glass filler or carbon filler) and resin (e.g. polycarbonate, acrylic resin or ABS) is given. The electrode plate 54 is integrally formed with the substrate 13 and the operation section 53, by multi-color molding, with resin. Note that the electrode plate 54 is provided not to be exposed on the design surface 11. Further, the electrode plate 54 and the operation section 53 are laminated in a vertical direction with respect to the design surface 11 (vertical direction in FIG. 26) and in contact with each other.

The rear surface 12 of the operation plate 10 is provided with a wiring 55 connected to the electrode plates 54. The wiring 55 is formed with a material having conductivity. It is integrally formed with the substrate 13, the operation section 53 and the electrode plate 54, by multi-color molding, with resin. Note that the wiring 55 is a high-permittivity material having high permittivity in comparison with that of the electrode plate 54. As the wiring 55, it is not necessary to use a material having translucency.

One end of the wiring 55 is connected to the electrode plate 54. The other end of the wiring 55 is connected via a connection wiring (flat cable 21) to the circuit board 40. With this configuration, a detection signal outputted from the electrode plate 54 is inputted through the wiring 55 and the flat cable 21 to the microcomputer (microcomputer 42) mounted on the circuit board 40. The microcomputer 42 determines whether or not the fingertip F has become into contact with the operation surfaces 11a, 11b based on change of the detection signal. When the microcomputer determines that the fingertip has become into contact with the operation surface, it outputs an ON signal to an operation object so as to control the operation object to conduct a desired operation. The microcomputer 42 when it determines presence/absence of contact operation corresponds to the "determination circuit". Light emitted from the light source 43 is guided to the corresponding electrode plate 54 with the light guide member (not shown), and is transmitted through the electrode plate 54 and the operation section 53.

Figure 27:
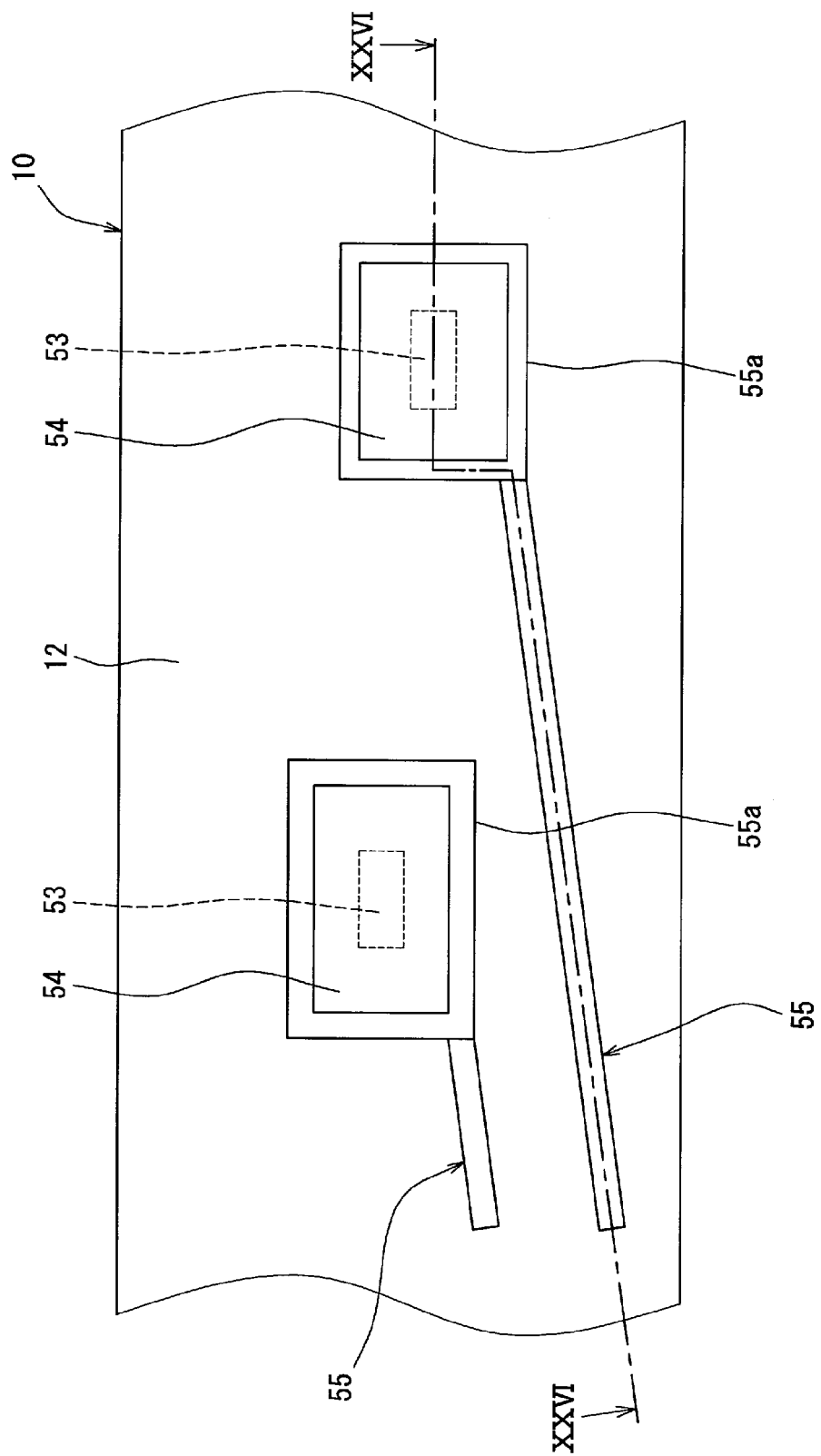
FIG. 27 is a XXVII arrow diagram of FIG. 26.

As shown in FIG. 27, the electrode plate 54 and the operation section 53 have a rectangular shape. The operation section 53 is provided so as to be overlapped with a projection range of the electrode plate 54. The "projection range" is a range overlapped with the electrode plate 54 in the design surface 11 when the operation plate 10 is viewed from a rear surface 54r of the electrode plate 54 in a vertical direction with respect to the rear surface 54r. The wiring 55 has a ring portion 55a extending in a ring shape so as to surround the electrode plate 54. The inner peripheral end surface of the ring portion 55a is in contact with the outer peripheral end surface of the electrode plate 54. The wiring 55 and the electrode plate 54 are exposed on the rear surface 12 of the operation plate 10.

As described above, according to the present embodiment, a substrate 11, the electrode plate 54 and the wiring 55 of the operation plate 10 are integrally formed by multi-color molding with resin. Accordingly, it is possible to omit work to attach the electrode plate 54 and the wiring 55 to the operation plate 10. Accordingly, it is possible to unnecessitate conventionally-necessary electrode-sheet attaching work, and it is possible to reduce the production cost of the capacitance-type switch.

Further, in the present embodiment, the wiring 55 has the ring portion 55a surrounding the electrode plate 54. As the entire outer peripheral end surface of the electrode plate 54 and the wiring 55 are in contact with each other, in comparison with a case where the wiring is in contact with a part of the outer peripheral end surface of the electrode plate 54, it is possible to increase the contact area. As the coupling capacity between the electrode plate 54 and the wiring 55 is increased, it is possible to increase voltage change of the detection signal transmitted with the wiring 55. Even by light touch on the operation surface 11a, i.e. even when the contact area between the fingertip F and the operation surface 11a is small, the detection signal changes by a predetermined or greater value with respect to reference voltage. Accordingly, it is possible to improve the switch sensitivity.

Further, in the present embodiment, the operation section 53 and the electrode plate 54 of the operation plate 10 are formed with a material having translucency. Accordingly, it is possible to form the electrode plate 54 integrally with the substrate 13 with resin and to realize transmission illumination of the operation surfaces 11a, 11b.

Sixteenth Embodiment

Figure 28:
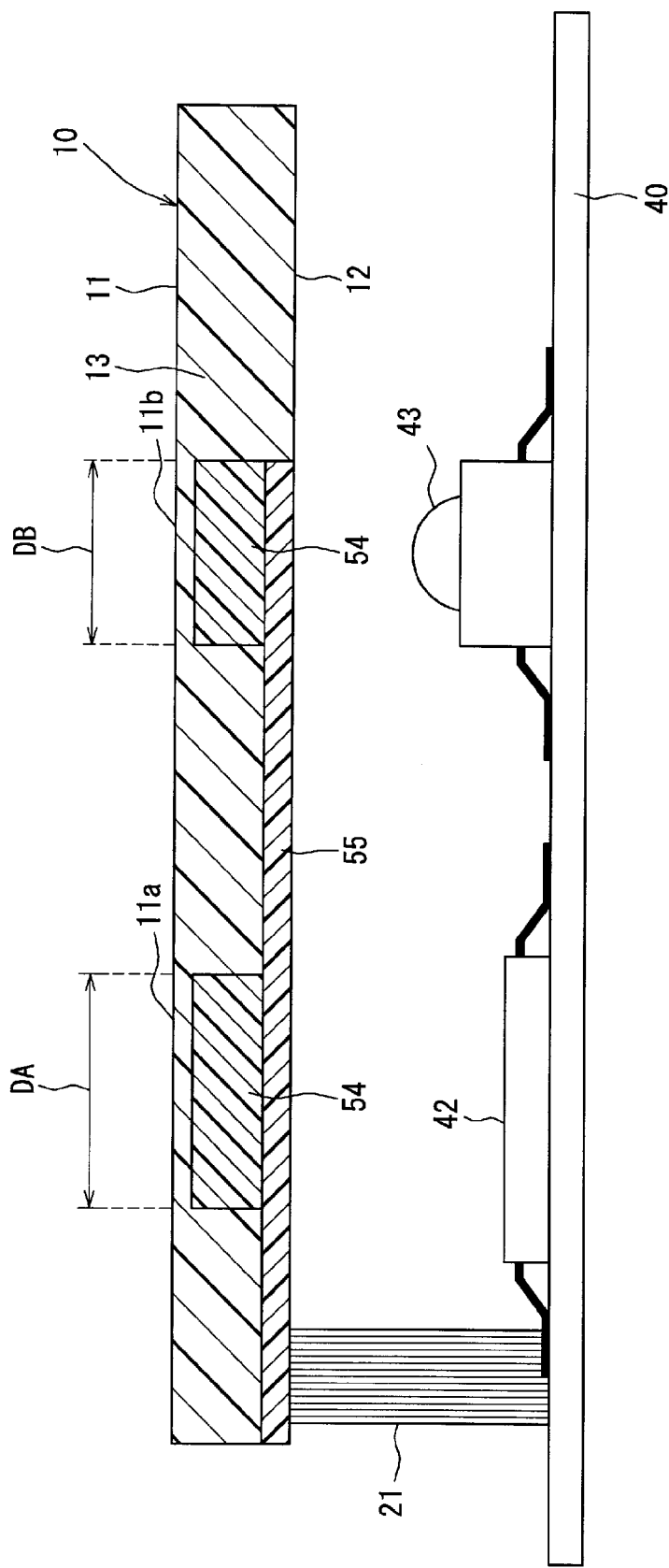
FIG. 28 is a cross-sectional diagram of the capacitance-type switch according to a sixteenth embodiment.

In the fifteenth embodiment, as the operation section 53 is formed with a material having translucency, the light emitted from the light source 59 is transmitted through the operation section 53 for transmission illumination. On the other hand, in the present embodiment shown in FIG. 28, the operation section 53 is omitted, the substrate 13 is formed with a material having translucency, and coating material having a light shielding characteristic is printed on the design surface 11 except particular ranges DA, DB.

The particular ranges DA, DB are positioned in the projection range of the electrode plate 54. In the substrate 13, the portions of the particular ranges DA, DB function as the operation surfaces 11a, 11b. In this configuration, the light emitted from the light source 59 is guided with the light guide member (not shown) to the corresponding electrode plate 54, and is transmitted through the electrode plate 54 and the substrate 13. As the light is transmitted through the corresponding operation surface among the operation surfaces 11a, 11b, it transmission-illuminates the operation surface.

With the above configuration, even when the substrate 13 having a light shielding characteristic is employed and the electrode plate 54, the wiring 55 and the substrate 13 are multi-color molded, it is possible to realize a configuration for transmission illumination by printing light shielding material on the design surface 11.

Seventeenth Embodiment

Figure 29:
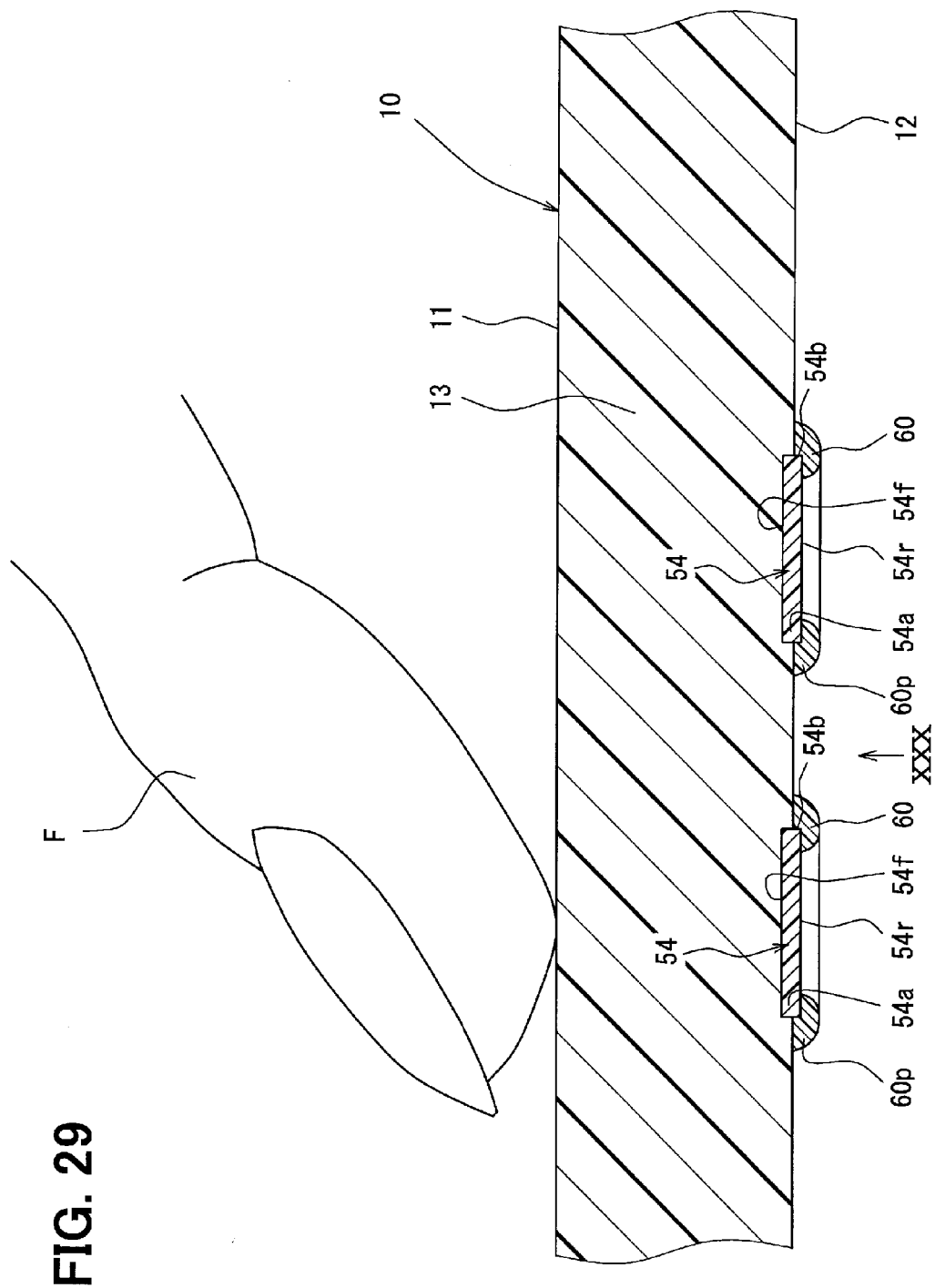
FIG. 29 is a general diagram of the capacitance-type switch according to a seventeenth embodiment and is a XXIX-XXIX cross-sectional diagram of FIG. 30.

In the present embodiment shown in FIGS. 29 and 30, a high-permittivity material 60 to be described below is further added to the configuration in the fifteenth embodiment. Further, the wiring 55 according to the fifteenth embodiment has the ring portion 55a, whereas in the present embodiment, the ring portion 55a is omitted.

The high-permittivity material 60 is formed with a material having high permittivity in comparison with that of the substrate 13. The high-permittivity material 60 corresponds to the high-permittivity material 22 in the preceding embodiments. The high-permittivity material 60 is provided on the outer peripheral portion 54a of the electrode plate 54. The high-permittivity material 60 is provided so as to cover the entire outer peripheral portion 54a. Regarding a part at the central portion of the rear surface 54r of the electrode plate 54 and other than the outer peripheral portion 54a, the high-permittivity material 60 is not provided.

Figure 31:
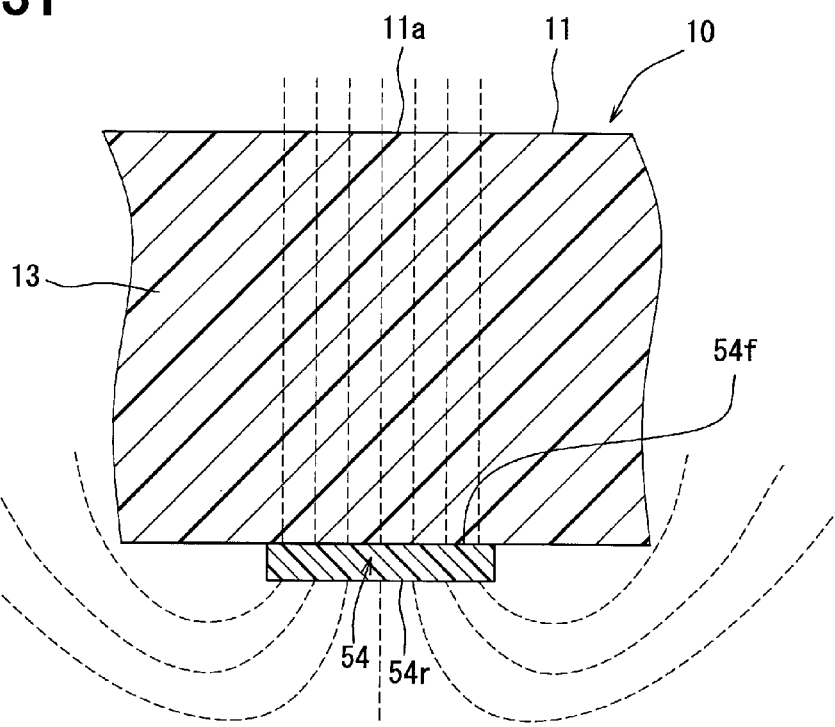
FIG. 31 is a diagram showing a comparative example.
Figure 32:
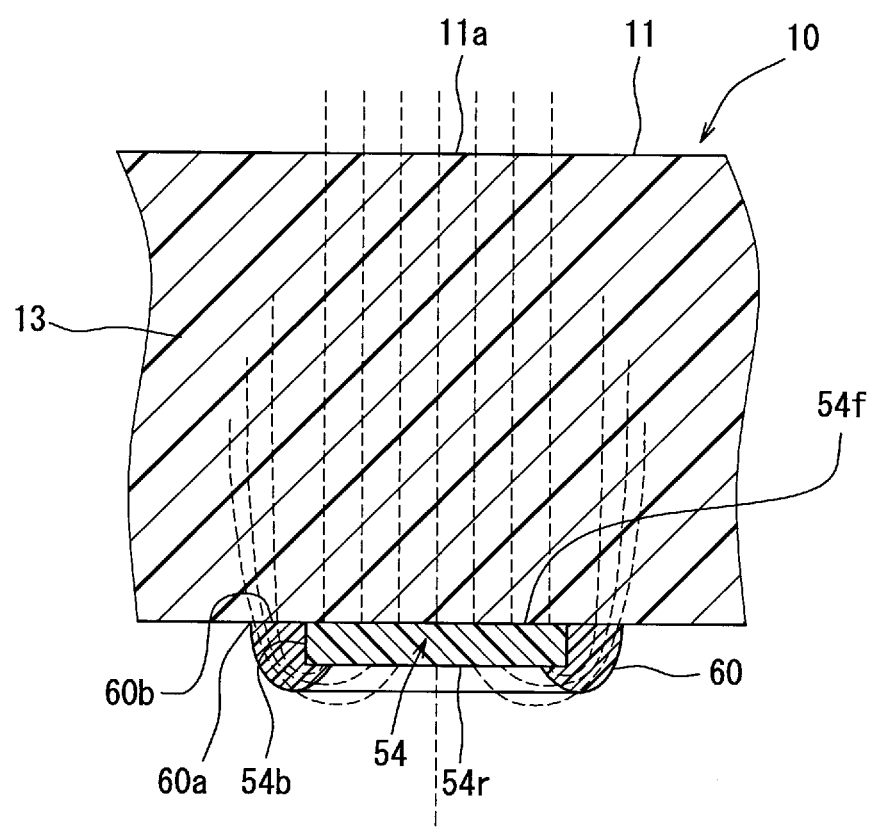
FIG. 32 is a diagram showing the distribution of lines of electric force emanating from the electrode plate.

FIGS. 31 and 32 respectively correspond to FIGS. 3 and 4. According to the present embodiment, it is possible to suppress erroneous operation by providing the high-permittivity material 60 on the outer peripheral portion 54a of the electrode plate 54. Further, it is possible to improve the switch sensitivity.

Further, the high-permittivity material 60 has an extending portion 60p extending in a direction away from an outer peripheral end surface 54b of the electrode plate 54. As the electrode plate 54 is not positioned between the rear surface of the extending portion 60p (extending portion rear surface 60b shown in FIG. 32) and the fingertip F, the effect of the suppression of erroneous operation is promoted.

Other Embodiments

The present invention is not limited to the contents of the embodiments, but may be changed and implemented as follows. Further, the characteristic constituent elements of the respective embodiments may be combined respectively arbitrarily.

In the respective embodiments, the operation plate 10 has a flat-plate shape with uniform plate thickness. Accordingly, it is possible to maintain a uniform distance between the operation surfaces 11a, 11b and the electrode plates 20, 54. On the other hand, the present invention is applicable to even a case where it is not possible to maintain a uniform distance between the operation surfaces 11a, 11b and the electrode plates 20, 54 when, e.g., the plate thickness of the operation plate 10 is non-uniform, or the operation plate has a shape with unevenness. In such case, it is possible to perform control to attain desired capacitance change by adjusting the shape and size of the high-permittivity materials 14, 141, 142, 15, 16, 60, 151, 152, 22, 221, 222, 223, 224.

In the respective embodiments, the electrode plates 20, 54 are formed with resin having conductivity. The electrode plates 20, 54 may be formed with metal. Further, transmission illumination may be omitted and the electrode plates 20, 54 may be formed with a material not having translucency. Further, when the transmission illumination is omitted, the high-permittivity materials 14, 141, 142, 151, 152, 22, 221, 222, 223, 224, and the substrate 13 may be formed with a material not having translucency.

In the embodiments, it is possible to set the shape and the size of the electrode plates 20, 54 and the shape and the size of the operation surfaces 11a, 11b with the same or different shape and size. In this case, the electrode plates 20, 54 may be formed into a shape having a size to cover the entire projection range of the operation surfaces 11a, 11b, and larger than the projection range, or the electrode plates 20, 54 may be formed into a shape to cover a part of the projection range.

In the examples shown in FIGS. 2, 8, 9 and 10, the high-permittivity material 22 is provided in a range to cover a part of the electrode plate 20. It may be provided in a range to cover the entire electrode plate.

In the first embodiment, the high-permittivity material 22 has the extending portion 22p. The outer peripheral edge portion 22a of the high-permittivity material 22 is positioned outside the outer peripheral end surface 20b of the electrode plate 20. On the other hand, it may be arranged such that the outer peripheral edge portion 22a is positioned on the outer peripheral end surface 20b or is positioned inside the outer peripheral end surface 20b using the high-permittivity material 22 without the extending portion 22p.

Figure 11:
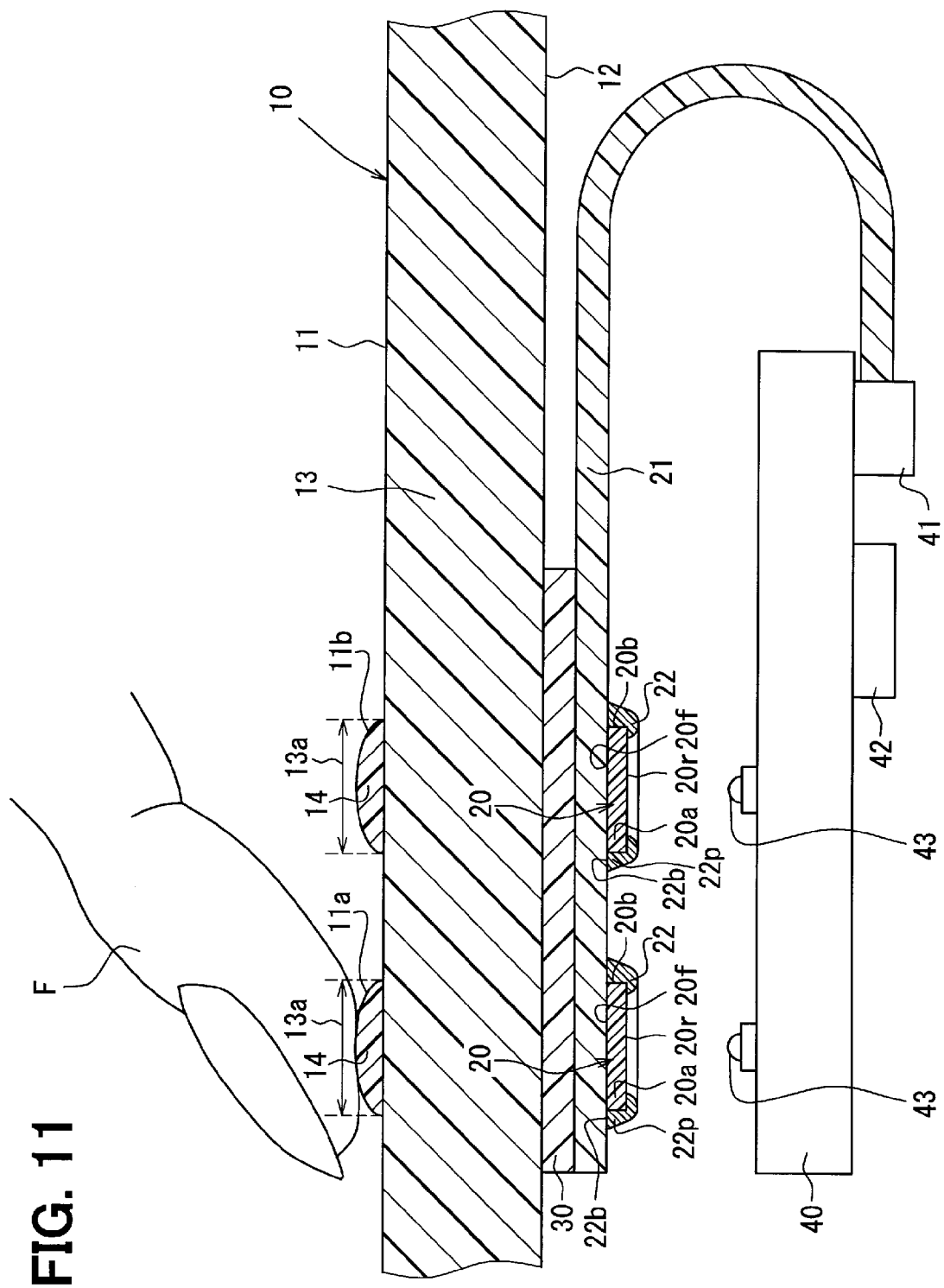
FIG. 11 is a cross-sectional diagram of the capacitance-type switch according to a sixth embodiment.
Figure 12:
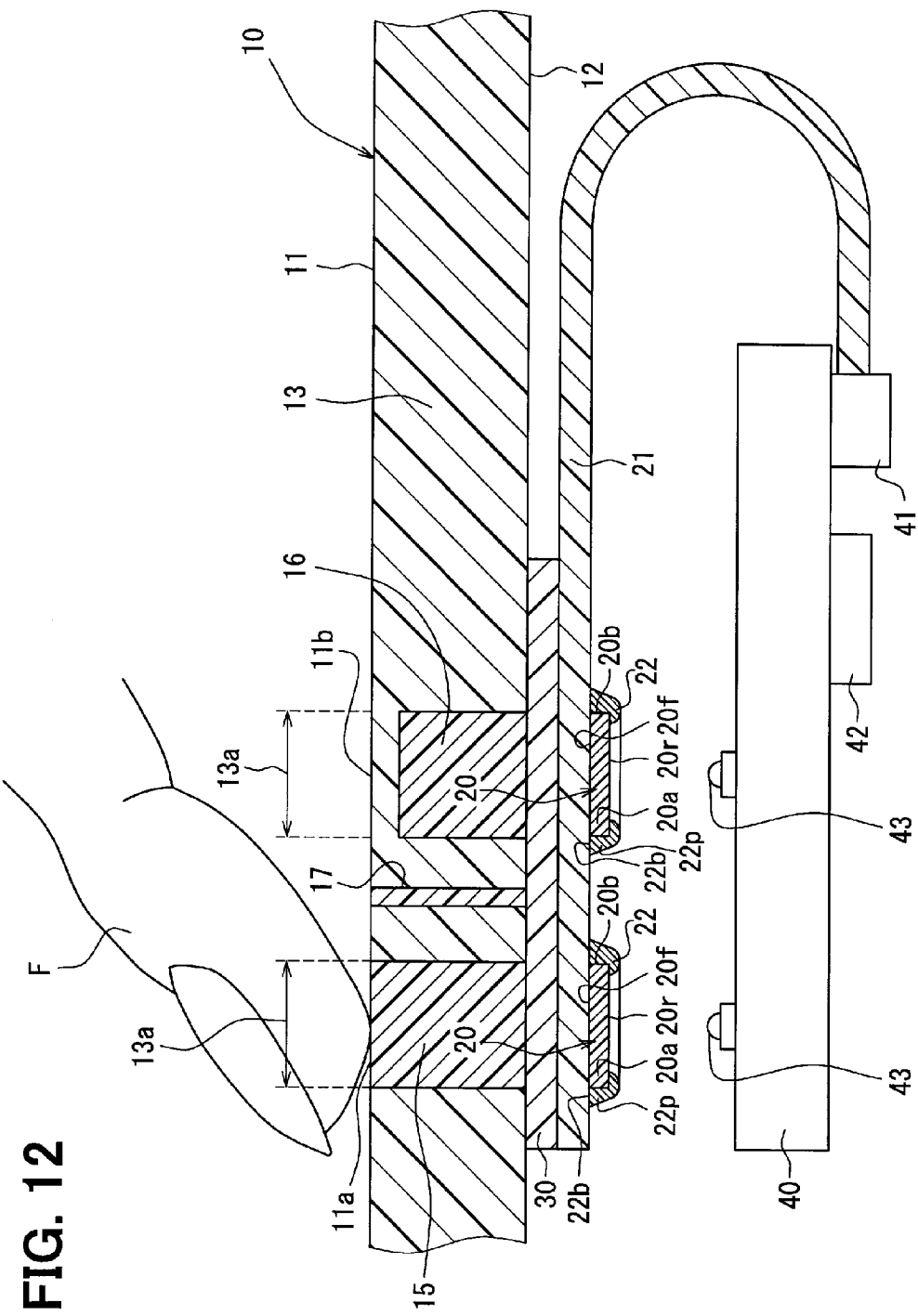
FIG. 12 is a cross-sectional diagram of the capacitance-type switch according to a seventh embodiment.

Upon implementation of the present invention, the configuration of FIG. 11 and that of FIG. 12 may be combined so as to have the high-permittivity material 22, the second high-permittivity material 14, and the third high-permittivity materials 15, 16. Note that the low-permittivity material 17 shown in FIG. 12 may be omitted.

The second high-permittivity material 14 shown in FIGS. 11 and 21 is raised from the flat surface of the substrate 13 toward the user side. It may be arranged such that the substrate 13 has a concave portion and the second high-permittivity material 14 is embedded in the concave portion. Otherwise, it may be arranged such that the second high-permittivity material 14 is formed into a thin film shape such that the user cannot recognize the raised portion, and the second high-permittivity material 14 substantially forms a flat surface the same as the design surface 11.

Figure 25:
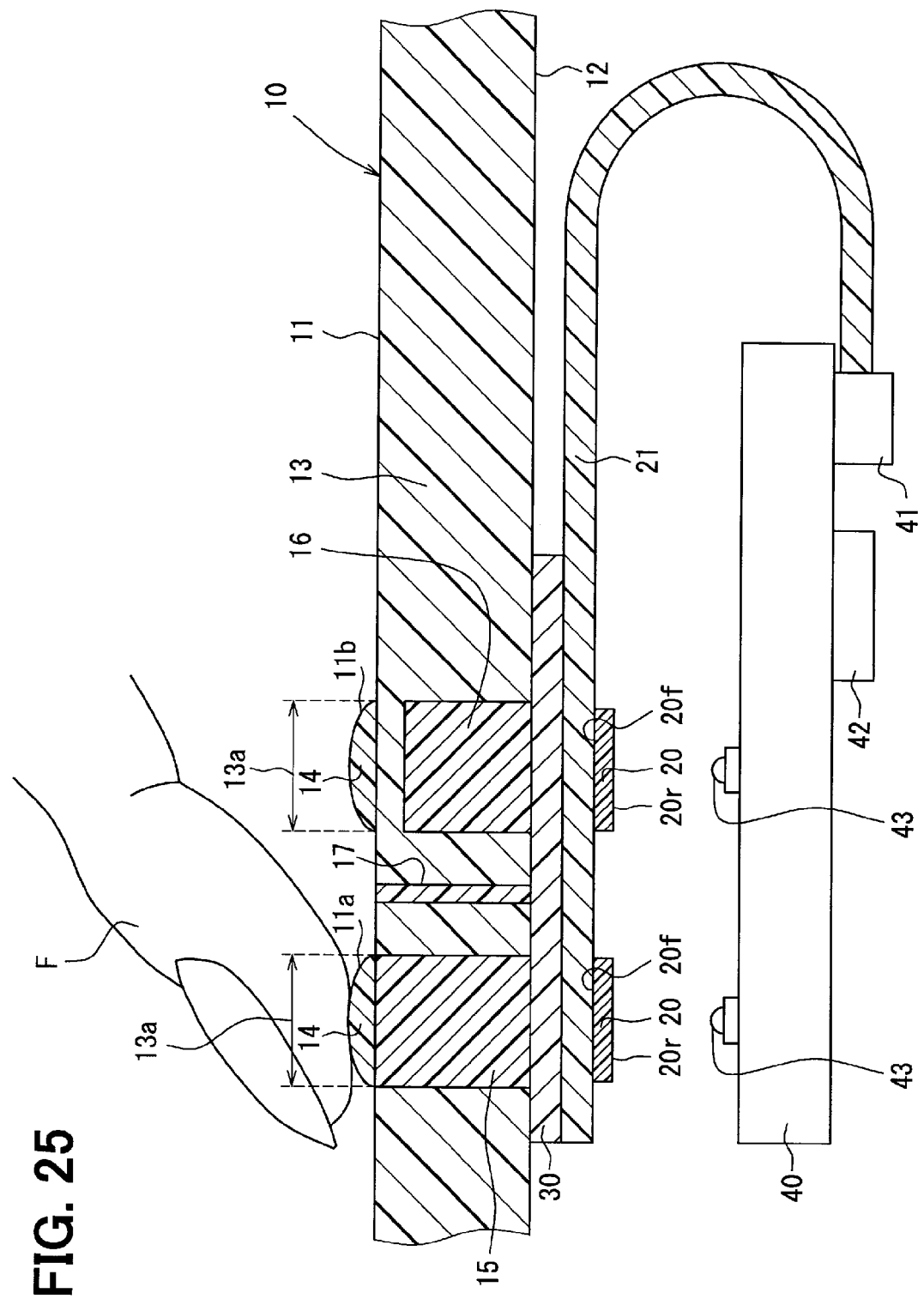
FIG. 25 is a cross-sectional diagram of the capacitance-type switch according to a fourteenth embodiment.

The low-permittivity material 17 shown in FIGS. 12, 16 and 25 is provided entirely through the substrate 13 in the plate thickness direction. The low-permittivity material 17 may be provided not so as to be exposed on the surface of the operation plate 10 on the side where the design surface 11 is formed.

The third high-permittivity materials 15, 16 and the low-permittivity material 17 shown in FIGS. 12, 16 and 25 are exposed on the rear surface of the substrate 13 and in contact with the adhesive 30 or the film material 21. On the other hand, the third high-permittivity materials 15, 16 and the low-permittivity material 17 may be provided not to be exposed on the rear surface of the substrate 13.

In the eighth embodiment shown in FIG. 13, the electrode plate 20 is applied to the operation plate 10. The electrode plate 20 may be attached to the operation plate 10 with adhesive. The operation plate 10 may be formed by integrally multi-color molding the substrate 13 and the electrode plate 20 with resin.

In the respective embodiments, the operation is premised on the contact between the user's fingertip F and the operation surfaces 11a, 11b, and the fingertip F is the operating body. On the other hand, it may be arranged such that the user holds e.g. a pen-type operating member, and the operation is premised on contact between the operating member and the operation surfaces 11a, 11b, and the operating member other than the human body is the operating body.

In the respective embodiments, the present invention is applied to a capacitance-type switch having a plurality of operation surfaces 11a, 11b. The present invention may be applied to a capacitance-type switch having one operation surface.

In the respective embodiments, the signal intensity with respect to capacitance is represented as a voltage value. The present invention is not limited to representation of capacitance with a voltage value. For example, it may be arranged such that a circuit which repeats charging and discharging with respect to a virtual capacitor formed with the electrode plate 20 is provided, the number of discharging is counted, and capacitance is represented with the count value.

In the tenth, the eleventh and the fourteenth embodiments, the low-permittivity material 17 may be omitted. Further, both of the second high-permittivity materials 15, 16 may be provided entirely through the substrate 13 in the plate thickness direction, or may be provided not to be exposed on the design surface 11.

In the tenth to fourteenth embodiments, the electrode plate 20 is applied to the film material 21, and the film material 21 is attached to the operation plate 10. In other words, the electrode plate 20 is attached to the operation plate 10 via the film material 21. On the other hand, the electrode plate 20 may be directly attached to the operation plate 10. For example, the electrode plate 20 may be evaporated onto the rear surface 12 of the substrate 13. The electrode plate 20 may be attached to the substrate 13 with an adhesive. The operation plate 10 may be formed by multi-color molding the substrate 11 and the electrode plate 20 with resin.

In the fifteenth embodiment, the wiring 55 is a conductor, and the electrode plate 54 is formed with a material having permittivity lower than that of the wiring 55. On the other hand, the electrode plate 54 may also be formed with a conductor. In this case, the electrode plate 54 and the wiring 55 may be formed with the same material so as to improve the operability of multi-color molding.

In the respective embodiments, the operation surfaces 11a, 11b are transmission-illuminated. It may be arranged such that the configuration of transmission illumination is omitted, and the electrode plate 54 is formed with a material not having translucency.

Figure 30:
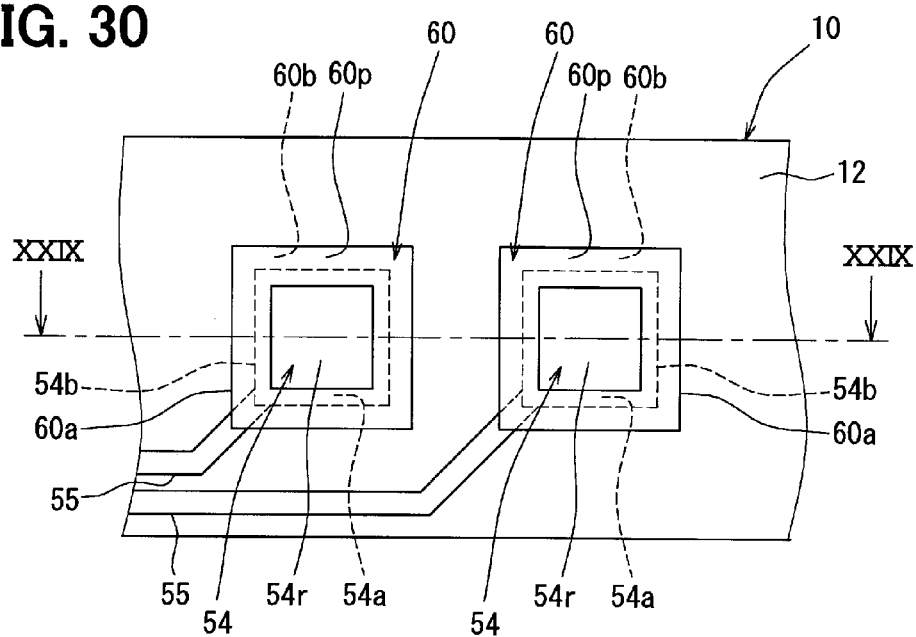
FIG. 30 is a XXX arrow diagram of FIG. 29.

In the example shown in FIG. 30, the high-permittivity material 60 is provided in the range to cover a part of the electrode plate 54. It may be provided in a range to cover the entire electrode plate.

In the seventeenth embodiment, the high-permittivity material 60 has the extending portion 60p, and the outer peripheral edge portion 60a of the high-permittivity material 60 is positioned outside the outer peripheral end surface 54b of the electrode plate 54. On the other hand, the outer peripheral edge portion 60a may be positioned on the outer peripheral end surface 54b or may be positioned inside the outer peripheral end surface 54b using the high-permittivity material 60 without the extending portion 60p.

What is claimed is:

1. A capacitance-type switch comprising:
   an operation plate forming an operation surface contact-operated with an operating body; and
   an electrode plate provided on the opposite side of the operation surface with respect to the operation plate, on/off-operated in correspondence with capacitance change caused between the operating body and the electrode plate, wherein
   a high-permittivity material having high permittivity in comparison with that of the operation plate is provided on an outer peripheral portion of the electrode plate.

2. The capacitance-type switch according to claim 1, wherein
   the high-permittivity material is provided on the entire outer peripheral portion and is formed in a shape surrounding the electrode plate.

3. The capacitance-type switch according to claim 1, wherein
   the high-permittivity material has an extending portion extending in a direction away from the electrode plate within a direction horizontal to the plate surface of the electrode plate.

4. The capacitance-type switch according to claim 1, wherein
   the operation plate has:
   a plate-shaped substrate; and
   a second high-permittivity material provided on the surface of the substrate, forming the operation surface, and having high permittivity in comparison with that of the substrate.

5. The capacitance-type switch according to claim 1, wherein
   the operation plate is integrally formed by multi-color molding the plate-shaped substrate and a third high-permittivity material having high permittivity in comparison with that of the substrate, with resin, and the third high-permittivity material is provided in a projection range of the electrode plate.

6. A capacitance-type switch comprising:
   an operation plate forming an operation surface contact-operated with an operating body; and
   an electrode plate provided on the opposite side of the operation surface with respect to the operation plate, on/off-operated in correspondence with capacitance change caused between the operating body and the electrode plate, wherein
   the operation plate is integrally formed by multi-color molding a plate-shaped substrate and a high-permittivity material having high permittivity in comparison with that of the substrate, with resin, and
   the high-permittivity material is provided in a projection range of the electrode plate, and wherein
   a plurality of operation surfaces are formed on the operation plate, and the electrode plate and the high-permittivity material are provided for the respective operation surfaces,
   the operation plate is integrally formed by multi-color molding the substrate, the high-permittivity material and a low-permittivity material having low permittivity in comparison with that of the substrate, with resin, and
   the low-permittivity material is provided between the adjacent third high-permittivity materials.

7. The capacitance-type switch according to claim 6, wherein
   the high-permittivity material is provided entirely through the substrate in a plate thickness direction.

8. The capacitance-type switch according to claim 6, wherein
   the high-permittivity material is provided not to be exposed on the surface of the operation plate on the side where the operation surface is formed.

9. A capacitance-type switch comprising:
   an operation plate forming an operation surface contact-operated with an operating body;
   an electrode plate provided on the opposite side of the operation surface with respect to the operation plate;
   a determination circuit that determines whether or not the operation surface has been contact-operated in correspondence with capacitance change caused between the operating body and the electrode plate; and
   a wiring connected to the electrode plate, that outputs a signal to the determination circuit, wherein
   the operation plate, the electrode plate and the wiring are integrally formed by multi-color molding, with resin, and wherein
   a high-permittivity material having high permittivity in comparison with that of the operation plate is provided on an outer peripheral portion of the electrode plate, and the high-permittivity material is integrally formed with the operation plate, the electrode plate and the wiring, by multi-color molding, with resin.

10. The capacitance-type switch according to claim 9, wherein
    the wiring has a ring portion extending in a ring shape surrounding the electrode plate.

11. The capacitance-type switch according to claim 9, wherein
    the electrode plate is formed with a material having translucency, and
    the switch further comprises a light source that transmission-illuminates the operation plate from the opposite side of the operation surface.

12. The capacitance-type switch according to claim 9, wherein
the high-permittivity material is provided on the entire outer peripheral portion and is formed in a shape surrounding the electrode plate.

13. The capacitance-type switch according to claim 9, wherein
the high-permittivity material has an extending portion extending in a direction away from the electrode plate within a direction horizontal to a plate surface of the electrode plate.

* * * * *